(12) United States Patent
Park et al.

(10) Patent No.: US 12,161,019 B2
(45) Date of Patent: *Dec. 3, 2024

(54) DISPLAY APPARATUS INCLUDING A HEAT-DISSIPATION MEMBER AND ELECTRONIC DEVICE INCLUDING THE SAME

(71) Applicant: SAMSUNG DISPLAY CO., LTD., Yongin-si (KR)

(72) Inventors: Byoungkyoo Park, Yongin-si (KR); Jooyoung Kim, Yongin-si (KR); Weejoon Jeong, Yongin-si (KR); Jangun Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/361,769

(22) Filed: Jul. 28, 2023

(65) Prior Publication Data

US 2023/0380214 A1 Nov. 23, 2023

Related U.S. Application Data

(63) Continuation of application No. 17/323,161, filed on May 18, 2021, now Pat. No. 11,751,431.

(30) Foreign Application Priority Data

Sep. 24, 2020 (KR) .................. 10-2020-0124032

(51) Int. Cl.
*H10K 50/87* (2023.01)
*H01L 23/552* (2006.01)
(Continued)

(52) U.S. Cl.
CPC ........... *H10K 50/87* (2023.02); *H01L 23/552* (2013.01); *H01L 25/18* (2013.01); *H05K 7/20963* (2013.01); *H10K 59/12* (2023.02)

(58) Field of Classification Search
CPC ...... H10K 50/87; H10K 59/12; H01L 23/552; H01L 25/18; H05K 7/20963
(Continued)

(56) References Cited

U.S. PATENT DOCUMENTS 6,097,698 A 8/2000 Miyahara et al.
6,765,798 B1 7/2004 Ratliff et al.
(Continued)

FOREIGN PATENT DOCUMENTS

EP 1 443 813 8/2004
EP 2 390 692 11/2011
(Continued)

OTHER PUBLICATIONS

Extended European Search Report Dated Jun. 14, 2022.

*Primary Examiner* — Quoc D Hoang
(74) *Attorney, Agent, or Firm* — F. Chau & Associates, LLC

(57) ABSTRACT

A display apparatus includes a display panel module including a front surface displaying an image and a rear surface opposite the front surface, and a heat dissipation member disposed on the rear surface of the display panel module and including a first portion, that is in contact with the display panel module, and a second portion that is spaced farther apart from the display panel module than the first portion is. The heat dissipation member includes at least one portion that is bent between the first portion and the second portion with respect to a bending axis parallel to the rear surface.

18 Claims, 15 Drawing Sheets

(51) Int. Cl.
*H01L 25/18* (2023.01)
*H05K 7/20* (2006.01)
*H10K 59/12* (2023.01)

(58) Field of Classification Search
USPC .......................................................... 257/72
See application file for complete search history.

(56) References Cited

U.S. PATENT DOCUMENTS

| | | | |
|---|---|---|---|
| 6,914,780 | B1 | 7/2005 | Shanker et al. |
| 9,569,024 | B2 | 2/2017 | Wu |
| 9,575,522 | B2 | 2/2017 | Seo et al. |
| 9,639,127 | B2 | 5/2017 | Kim |
| 10,334,716 | B2 | 6/2019 | Strader et al. |
| 10,561,886 | B2 | 2/2020 | De La Fuente |
| 11,751,431 | B2 * | 9/2023 | Park .................. H05K 7/20963 |
| | | | 257/72 |
| 2007/0017686 | A1 | 1/2007 | Numata |
| 2008/0130231 | A1 | 6/2008 | Chen |
| 2008/0137337 | A1 | 6/2008 | Cheng et al. |
| 2008/0203880 | A1 | 8/2008 | Kim |
| 2010/0181665 | A1 | 7/2010 | Casey et al. |
| 2011/0100595 | A1 | 5/2011 | Liu et al. |
| 2013/0202352 | A1 | 8/2013 | Lin |
| 2017/0102137 | A1 | 4/2017 | Cho et al. |
| 2018/0192546 | A1 | 7/2018 | Chen et al. |
| 2018/0269806 | A1 | 9/2018 | Oh et al. |
| 2020/0204666 | A1 | 6/2020 | Hong |
| 2021/0126209 | A1 * | 4/2021 | Lee ..................... H10K 59/123 |
| 2022/0093890 | A1 | 3/2022 | Park et al. |

FOREIGN PATENT DOCUMENTS

| | | |
|---|---|---|
| EP | 2 582 218 | 4/2013 |
| EP | 2843501 | 3/2015 |
| JP | 2007-041383 | 2/2007 |
| JP | 2008-260431 | 10/2008 |
| JP | 2009-128413 | 6/2009 |
| JP | 2014-138069 | 7/2014 |
| KR | 10-2006-0061938 | 6/2006 |
| KR | 10-2006-0065114 A | 6/2006 |
| KR | 10-2006-0110654 A | 10/2006 |
| KR | 10-2015-0026445 A | 3/2015 |
| KR | 10-1794647 | 11/2017 |
| KR | 10-2018-0026763 A | 3/2018 |
| KR | 10-2018-0036836 | 4/2018 |
| KR | 10-2018-0104530 | 9/2018 |
| KR | 10-2099255 | 4/2020 |
| KR | 10-2020-0077931 | 7/2020 |
| WO | WO 2011/112206 | 9/2011 |
| WO | WO 2011/146302 | 11/2011 |
| WO | WO2011160014 | 12/2011 |
| WO | WO 2014/169814 | 10/2014 |
| WO | WO 2014/021048 | 7/2016 |

\* cited by examiner

DISPLAY APPARATUS INCLUDING A HEAT-DISSIPATION MEMBER AND ELECTRONIC DEVICE INCLUDING THE SAME

CROSS-REFERENCE TO RELATED APPLICATION

This application is a Continuation of co-pending U.S. patent application Ser. No. 17/323,161, filed on May 18, 2021, which claims priority under 35 U.S.C. § 119 to Korean Patent Application No. 10-2020-0124032, filed on Sep. 24, 2020 in the Korean Intellectual Property Office, the disclosures of which are incorporated by reference herein in their entirety.

TECHNICAL FIELD

The present disclosure relates to a display apparatus and, and more particularly, to a display apparatus and an electronic device including the display apparatus.

DISCUSSION OF THE RELATED ART

Display apparatuses are devices that display data visually. A display panel provided in the display apparatus displays an image through a plurality of pixels formed in a display area thereof. Scan lines and data lines are disposed within the display area. These lines are insulated from each other. Pixel circuits electrically connect the scan lines and data lines to each pixel. In a peripheral area of the display panel, there may be provided various wirings, which transmit electrical signals to the pixel circuits of the display area, a scan driving portion, a data driving portion, a control portion, and the like. The peripheral area may be a non-display area where no image is displayed. Thus, pixels may be absent from the non-display area.

As display apparatuses have become thinner and lighter, the usage of display apparatuses has widened. Furthermore, as the performance of display apparatuses increases (for example, resolution increases, color depth increases, refresh rate increases, etc.), elements included in the display apparatuses are becoming highly integrated, and this leads to more heat being generated during the driving of the display apparatuses.

SUMMARY

A display apparatus includes a display panel module including a front surface providing an image and a rear surface opposite to the front surface, and a heat dissipation member disposed on the rear surface of the display panel module and including a first portion in contact with the display panel module and a second portion that is farther away from the display panel module than the first portion is. The heat dissipation member includes at least one portion that is bent between the first portion and the second portion with respect to a bending axis parallel to the rear surface.

The display apparatus may further include a control module disposed on the rear surface of the display panel module and electrically connected to the display panel module. The first portion of the heat dissipation member may at least partially overlap the control module.

The second portion of the heat dissipation member might not overlap the control module.

The display panel module may include a display panel including a substrate and a light-emitting element disposed on the substrate, a lower cover covering one surface of the display panel, and a first heat transfer sheet disposed between the display panel and the lower cover.

The control module may include a circuit substrate on which a timing controller is mounted and a shield member at least partially covering the timing controller.

The first portion of the heat dissipation member may at least partially overlap the timing controller.

The control module may further include a first thermal interface material disposed between the circuit substrate and the shield member.

The second portion of the heat dissipation member may include a first surface facing the display panel module and a heat sink disposed on the first surface.

The heat dissipation member may be bent such that each of the first portion and the second portion at least partially overlap the control module.

The heat dissipation member may include a third portion that is disposed at an opposite side of the second portion with respect to the first portion and is farther away from the display panel module than the first portion is.

Each of the second portion and the third portion of the heat dissipation member may include a first surface facing the display panel module and a heat sink disposed on the first surface.

The display apparatus may further include a pressing member configured to apply a pressure such that the first portion of the heat dissipation member and the display panel module contact each other.

The pressing member may include a main body portion including a head located at one side and screw-coupled to one portion of the display panel module at another side, and an elastic portion disposed between the head and the first portion of the heat dissipation member.

A bent angle of the heat dissipation member may be less than or equal to 90°.

The heat dissipation member may be provided in a plate shape or a pipe shape.

An electronic device includes a display apparatus including a display panel module configured to display an image through a front surface and a heat dissipation member disposed on a rear surface of the display panel module, and a rear cover disposed on the rear surface of the display panel module and spaced apart from the display panel module. The display panel module includes a light-emitting element configured to emit light through the front surface and a transistor electrically connected to the light-emitting element. The heat dissipation member is arranged between the display panel module and the rear cover and is bent with respect to a bending axis parallel to the rear surface to include a first portion in contact with the display panel module and a second portion arranged closer to the rear cover than the first portion is.

The display apparatus may further include a control module disposed between the display panel module and the rear cover and electrically connected to the display panel module. The display panel module, the first portion of the heat dissipation member, and the control module at least partially overlap one another on a plane.

The heat dissipation member may form a heat transfer path to transfer heat generated from the display panel module to the rear cover.

The electronic device may further include a second heat transfer sheet disposed between the second portion of the heat dissipation member and the rear cover.

On a plane, an area of the second heat transfer sheet may be greater than an area of the second portion of the heat dissipation member.

The electronic device may further include a second thermal interface material disposed between the second portion of the heat dissipation member and the rear cover.

BRIEF DESCRIPTION OF THE DRAWINGS

The above and other aspects, features, and elements of certain embodiments of the disclosure will be more apparent from the following description taken in conjunction with the accompanying drawings, in which.

DETAILED DESCRIPTION

Figure 1:
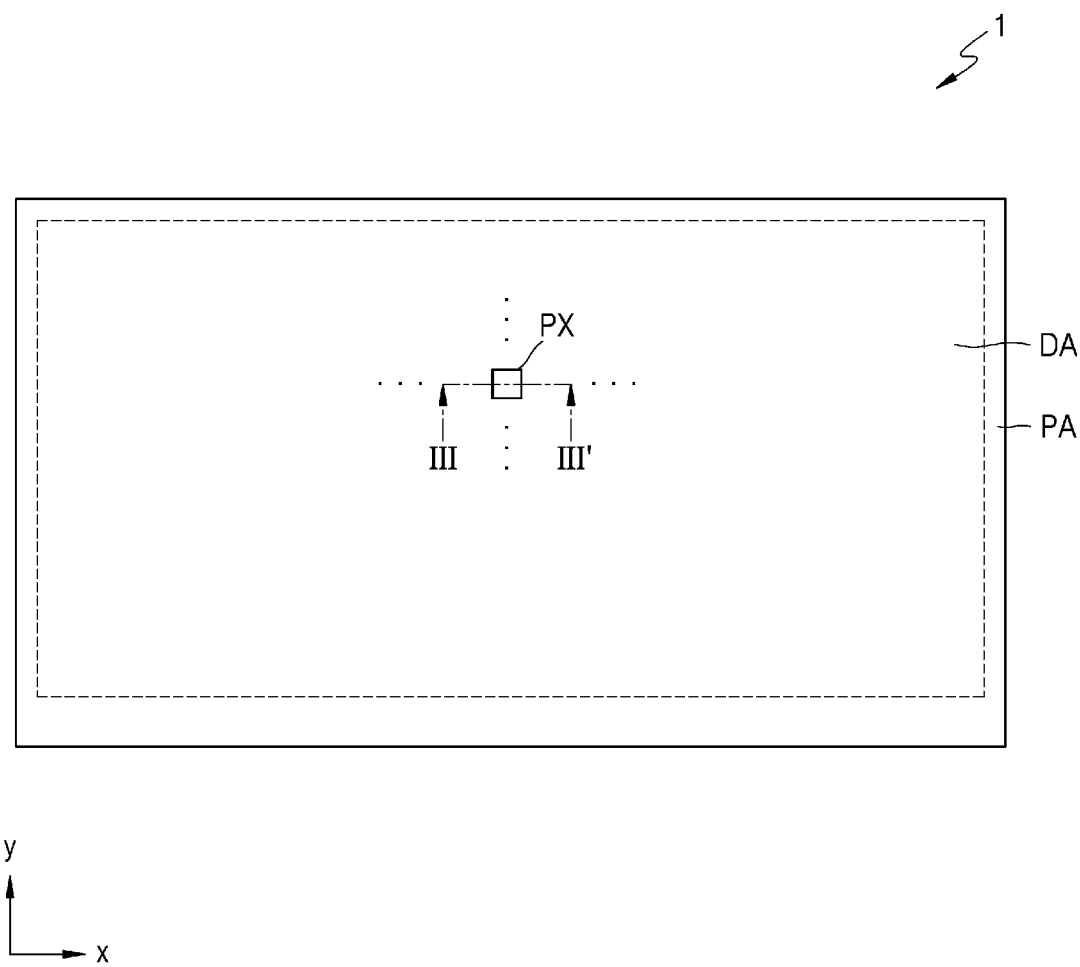
FIG. 1 is a schematic plan view illustrating an electronic device according to an embodiment of the present disclosure.

Reference will now be made in detail to embodiments, examples of which are illustrated in the accompanying drawings, wherein like reference numerals refer to like elements throughout the figures and the specification. In this regard, the present embodiments may have different forms and should not necessarily be construed as being limited to the descriptions set forth herein.

In the embodiments below, it will be understood that although the terms "first," "second," etc. may be used herein to describe various components, these components are not necessarily limited by these terms.

In the embodiments below, the singular forms "a," "an" and "the" are intended to include the plural forms as well, unless the context clearly indicates otherwise.

In the embodiments below, when a part may "comprise," "include," or "have" a certain constituent element, unless specified otherwise, it might not be construed to exclude another constituent element but may be construed to further include other constituent elements.

In the embodiments below, it will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. Accordingly, the following embodiments are not necessarily limited thereto.

When a certain embodiment may be implemented differently, a specific process order may be performed differently from the described order. For example, two consecutively described processes may be performed substantially at the same time or performed in an order opposite to the described order.

In the specification, the expressions such as "A or B," "at least one of A and/or B," or "at least one or more of A and/or B" may include all available combinations of items listed together. For example, the expressions such as "A or B," "at least one of A and B," or "at least one of A or B" may signify all cases of (1) including at least one A, (2) including at least one B, or (3) including both of at least one A and at least one B.

In the embodiments below, it will be understood that when a layer, region, or component is referred to as being "connected to" another layer, region, or component, it can be directly connected to the other layer, region, or component or indirectly connected to the other layer, region, or component via intervening layers, regions, or components. For example, in the specification, when a layer, region, or component is referred to as being electrically connected to another layer, region, or component, it can be directly electrically connected to the other layer, region, or component or indirectly electrically connected to the other layer, region, or component via intervening layers, regions, or components.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a schematic plan view illustrating an electronic device 1 according to an embodiment of the present disclosure.

Referring to FIG. 1, the electronic device 1 may include a display area DA and a peripheral area PA located outside of the display area DA. The electronic device 1 may provide an image through an array of a plurality of pixels PX arranged in the display area DA in two dimensions. A pixel PX may be a light-emitting area where a light-emitting element emits light. A light-emitting element and a pixel circuit electrically connected to the light-emitting element may be disposed in the display area DA.

The peripheral area PA is an area that does not provide an image (e.g., there are no pixels disposed within the peripheral area PA), and may partially or entirely surround the display area DA. A driver, and the like, which provides an electrical signal or power to the pixel circuit corresponding to each of the pixels PX of the display area DA, may be disposed in the peripheral area PA, and/or a pad that is an area where an electronic device, a printed circuit board (PCB), and the like are electrically connected may be disposed in the peripheral area PA.

In the following description, although the electronic device 1 is described to include an organic light-emitting diode OLED as a light-emitting element, the electronic device 1 of the disclosure is not limited thereto. For example, the electronic device 1 may include a display apparatus such as an inorganic light-emitting display including an inorganic light-emitting diode, a quantum dot light-emitting display, and the like. In some embodiments, the inorganic light-emitting diode may be referred to as a micro LED.

The electronic device 1 may include not only a portable electronic device such as a mobile phone, a smart phone, a tablet computer, a mobile communication terminal, an electronic organizer, an electronic book (e-book reader), a portable multimedia player (PMP), a navigation device, an ultra mobile PC (UMPC), and the like, but also various products such as a television, a notebook computer, a computer monitor, a digital signboard, internet of things (IOT) device, and the like. Furthermore, the electronic device 1, according to an embodiment of the present disclosure, may include a wearable device such as a smart watch, a watch phone, a glasses-type display, and a head mounted display (HMD). Furthermore, the electronic device 1, according to an embodiment of the present disclosure, may include an instrument panel of a car, and a center information display (CID) provided on a center fascia or a dashboard of a car, a room mirror display replacing a side mirror of a car, a device provided on a rear side of a front seat for entertainment for a rear seat of a car.

Figure 2:
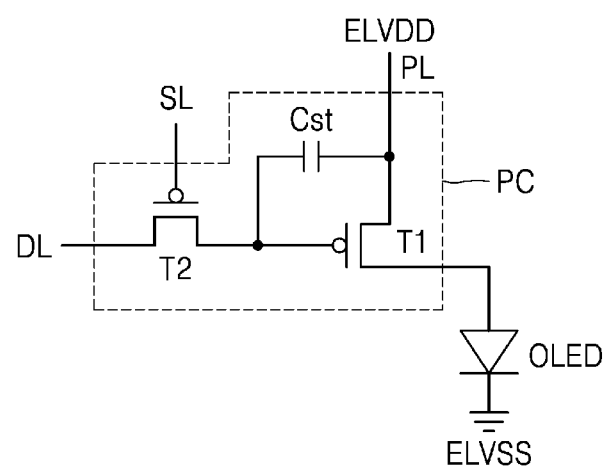
FIG. 2 is an equivalent circuit diagram illustrating any one pixel circuit included in an electronic device according to an embodiment of the present disclosure.

FIG. 2 is an equivalent circuit diagram illustrating any one pixel circuit included in an electronic device according to an embodiment of the present disclosure.

Referring to FIG. 2, a pixel circuit PC may include a plurality of thin film transistors and a storage capacitor, and may be electrically connected to the organic light-emitting diode OLED. In an embodiment, the pixel circuit PC may include a driving thin film transistor T1, a switching thin film transistor T2, and a storage capacitor Cst.

The switching thin film transistor T2 is connected to a scan line SL and a data line DL, and may transmit a scan signal input from the scan line SL or a data signal or a data voltage input from the data line DL to the driving thin film transistor T1 based on a switching voltage. The storage capacitor Cst is connected to the switching thin film transistor T2 and a driving voltage line PL, and may store a voltage corresponding to a difference between a voltage received from the switching thin film transistor T2 and a first power voltage ELVDD supplied through the driving voltage line PL.

The driving thin film transistor T1 is connected to the driving voltage line PL and the storage capacitor Cst, and may control a driving current flowing from the driving voltage line PL to the organic light-emitting diode OLED in response to a voltage value stored in the storage capacitor Cst. A common electrode, for example, a cathode, of the organic light-emitting diode OLED may receive a second power voltage ELVSS. The organic light-emitting diode OLED may emit light having a desired brightness by the control of the driving current.

Although a case in which the pixel circuit PC includes two thin film transistors and one storage capacitor is described above, the disclosure is not necessarily limited thereto. For example, the pixel circuit PC may include three or more thin film transistors and/or two or more storage capacitors. In an embodiment, the pixel circuit PC may include seven thin film transistors and one storage capacitor. The number of thin film transistors and storage capacitors may be variously changed according to the design of the pixel circuit PC. However, for convenience of explanation, a case in which the pixel circuit PC includes two thin film transistors and one storage capacitor is described.

Figure 3:
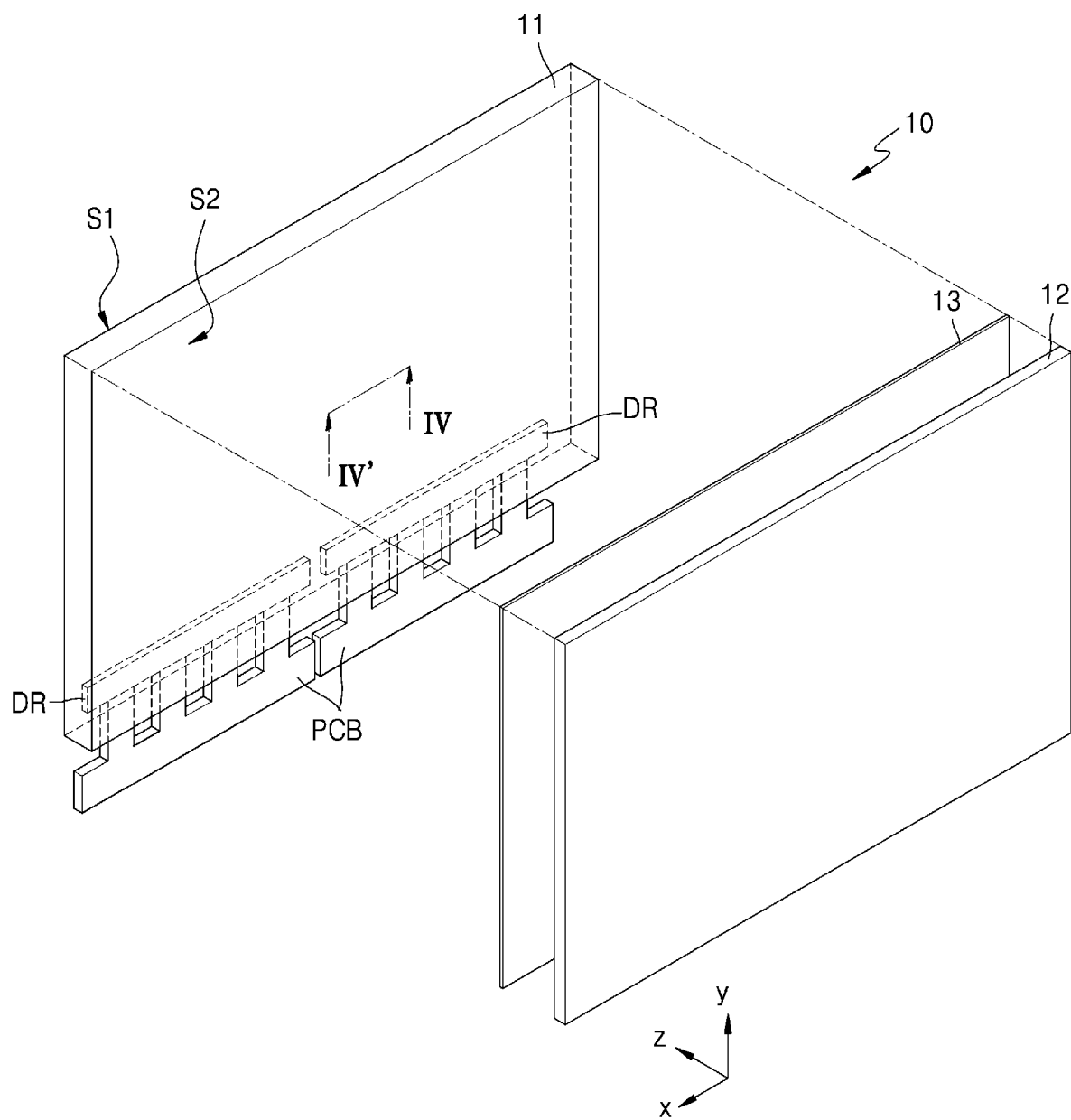
FIG. 3 is a schematic exploded perspective view illustrating a display panel module provided in an electronic device according to an embodiment of the present disclosure.

FIG. 3 is a schematic exploded perspective view illustrating a display panel module 10 provided in the electronic device 1 of FIG. 1.

Referring to FIG. 3, the display panel module 10 provided in the electronic device 1 of FIG. 1 may include a display panel 11, a lower cover 12, and a first heat transfer sheet 13 disposed between the display panel 11 and the lower cover 12.

The display panel 11 may include the organic light-emitting diode OLED of FIG. 2 as a light-emitting element and the pixel circuit PC of FIG. 2 electrically connected to the organic light-emitting diode OLED. The organic light-emitting diode OLED and the pixel circuit PC may be arranged on a substrate of the display panel 11. Furthermore, the display panel 11 may include various wirings for applying electrical signals to the pixel circuit PC and/or a conductive layer. A stacking structure of the display panel 11 is described below with reference to FIG. 4.

The display panel 11 may display an image by using light emitted from the organic light-emitting diode OLED, and a surface providing the image may be defined to be a first surface S1. For example, in FIG. 3, the first surface S1 of the display panel 11 may be a surface facing in a +z direction. The display panel 11 may include a second surface S2 that is a surface opposite to the first surface S1.

The lower cover 12 may cover the second surface S2 of the display panel 11. The lower cover 12 may strengthen the display panel module 10 by supporting the display panel 11. To this end, the lower cover 12 may include a material having a certain strength, and may include, for example, a metal material. In an embodiment, the lower cover 12 may include a metal material having a high heat conductivity, for example, aluminum, to effectively dissipate the heat transferred from the display panel 11.

The first heat transfer sheet 13 may be provided between the display panel 11 and the lower cover 12. The first heat transfer sheet 13 may transfer the heat generated from the display panel 11 to the lower cover 12. Furthermore, when heat is excessively generated in a local portion of the display panel 11, the first heat transfer sheet 13 may perform a function of dispersing the heat to a larger area. To this end, the first heat transfer sheet 13 may include a material exhibiting superior heat conductivity, for example, graphite, silicon resin, acryl resin, urethane resin, and other materials having heat conductivity within the range of, or larger than, those mentioned. The first heat transfer sheet 13 may include graphite having a high heat conductivity in a surface direction and a thickness direction and distributing heat uniformly therethrough.

As heat may be generated over the entire area of the display panel 11 during the operation of the display panel 11, in an embodiment, the first heat transfer sheet 13 may overlap the entire area of the display panel 11. The disclosure is not limited thereto, and the first heat transfer sheet 13 may overlap a partial area of the display panel 11.

The display panel 11 may include a driving circuit portion DR arranged at one side thereof. For example, the driving circuit portion DR may be arranged in the peripheral area PA of the display panel 11 shown in FIG. 1. The driving circuit portion DR may be mounted on the display panel 11 in a method, for example, a chip-on-glass (COG) method, a chip-on-film (COF) method, or a chip-on-plastic (COP) method. The driving circuit portion DR may generate an electrical signal in response to externally received power and control signal, and may provide the electrical signal to each of the pixel circuit PCs arranged in the display area DA of the display panel 11.

Furthermore, a pad portion may be arranged at one side of the display panel 11, and the pad portion may be electrically connected to the driving circuit portion DR via a wiring or a conductive layer. The printed circuit board PCB is attached to the pad portion, and may be electrically connected to the driving circuit portion DR via the pad portion.

The printed circuit board PCB may be electrically connected to an external control device via a connector. The printed circuit board PCB may be connected to the external control device and may transmit the power and/or control signal received from the external control device to the driving circuit portion DR. In an embodiment, the printed circuit board PCB may include a flexible printed circuit board (FPCB) having a flexible characteristic in which it may be bent to an observable degree without cracking or otherwise being damaged. The flexible printed circuit board may be folded or bent, and may be arranged to overlap at least a partial area of the display panel 11 by being folded onto the second surface S2 of the display panel 11. In this state, the printed circuit board PCB may be provided between the lower cover 12 and the first heat transfer sheet 13. Accordingly, the printed circuit board PCB may be covered by the lower cover 12.

Figure 4:
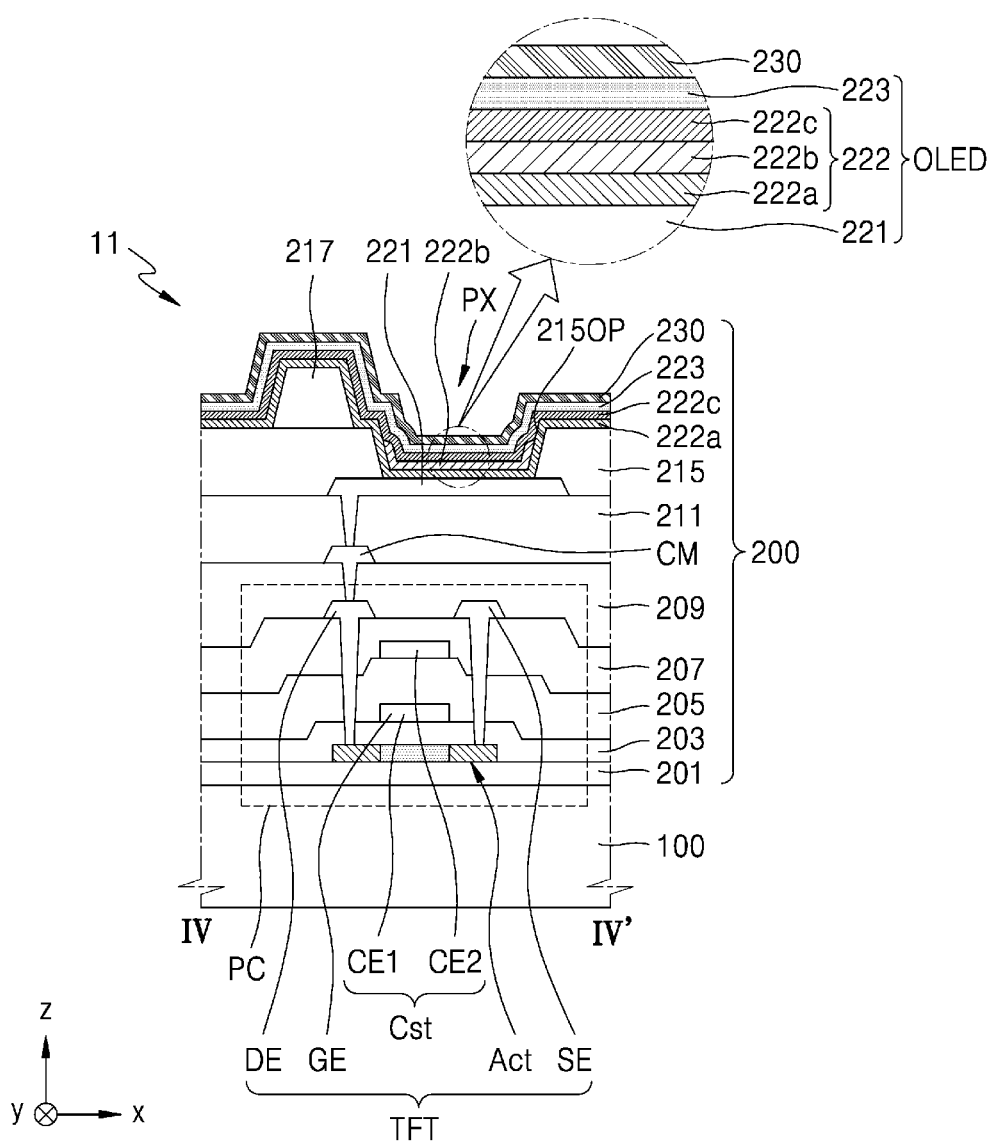
FIG. 4 is a schematic cross-sectional view illustrating a portion of a display panel provided in an electronic device according to an embodiment of the present disclosure.

FIG. 4 is a schematic cross-sectional view illustrating a portion of the display panel 11 provided in an electronic device according to an embodiment. FIG. 4 may correspond to a cross-section of the display panel 11 taken along line IV-IV' of FIG. 3.

Referring to FIG. 4, the display panel 11 may include a substrate 100. The substrate 100 may include a glass material or a polymer resin. For example, the substrate 100 may include a glass material having $SiO_2$ as a main ingredient, or may include a resin such as a reinforced plastic. The substrate 100 may be a single layer or may have multiple layers (e.g., a multilayered structure, referred to herein as "multilayer").

A display layer 200 may be formed on the substrate 100. The display layer 200 may include the pixel circuit PC and the organic light-emitting diode OLED electrically connected to the pixel circuit PC. Furthermore, the display layer 200 may include insulating layers arranged above and/or under the pixel circuit PC and the organic light-emitting diode OLED.

For example, a buffer layer 201 may be used for preventing intrusion of impurities into a semiconductor layer Act of a thin film transistor TFT on the substrate 100. The buffer layer 201 may include an inorganic insulating material such as a silicon nitride, a silicon oxynitride, and a silicon oxide, and may be a single layer or multilayer including the above-described inorganic insulating material.

The pixel circuit PC may be arranged on the buffer layer 201. The pixel circuit PC may include a TFT and the storage capacitor Cst. The thin film transistor TFT may include the semiconductor layer Act, a gate electrode GE, a source electrode SE, and a drain electrode DE. The thin film transistor TFT of FIG. 4 may be one of the transistors described with reference to FIG. 2, for example, a driving transistor. In the present embodiment, although the gate electrode GE is illustrated to be a top gate type arranged on the semiconductor layer Act with a gate insulating layer 203 disposed therebetween, according to an embodiment, the thin film transistor TFT may be of a bottom gate type.

The semiconductor layer Act may include polysilicon. Alternatively, the semiconductor layer Act may include amorphous silicon, oxide semiconductor, organic semiconductor, and the like. The gate electrode GE may include a low-resistance metal material. The gate electrode GE may include a conductive material including molybdenum (Mo), aluminum (Al), copper (Cu), titanium (Ti), and the like, and may be formed in a multilayer or a single layer including the above material.

The gate insulating layer 203 between the semiconductor layer Act and the gate electrode GE may include an inorganic insulating material such as a silicon oxide, a silicon nitride, a silicon oxynitride, an aluminum oxide, a titanium oxide, a tantalum oxide, a hafnium oxide, and the like. The gate insulating layer 203 may be a single layer or multilayer including the above-described material.

The source electrode SE and the drain electrode DE each may include a material having a high electrical conductivity. The source electrode SE and the drain electrode DE each may include an electrically conductive material including Mo, Al, Cu, Ti, and the like, and may be formed in a multilayer or a single layer including the above material. In an embodiment, the source electrode SE and the drain electrode DE each may be formed in in a multilayer of Ti/Al/Ti.

The storage capacitor Cst may include a lower electrode CE1 and an upper electrode CE2, which overlap each other with a first interlayer insulating layer 205 disposed therebetween. The storage capacitor Cst may overlap the thin film transistor TFT. In this regard, FIG. 4 illustrates that the gate electrode GE of the thin film transistor TFT is the lower electrode CE1 of the storage capacitor Cst. In another embodiment, the storage capacitor Cst might not overlap the thin film transistor TFT. The storage capacitor Cst may be covered with a second interlayer insulating layer 207.

The first interlayer insulating layer 205 and the second interlayer insulating layer 207 each may include an inorganic insulating material such as a silicon oxide, a silicon nitride, a silicon oxynitride, an aluminum oxide, a titanium oxide, a tantalum oxide, a hafnium oxide, and the like. The first interlayer insulating layer 205 and the second interlayer insulating layer 207 each may be a single layer or multilayer including the above-described material.

The pixel circuit PC including the thin film transistor TFT and the storage capacitor Cst may be covered with a first organic insulating layer 209. An upper surface of the first organic insulating layer 209 may include an approximately flat surface as a planarization insulating layer. The first organic insulating layer 209 may include organic insulating materials such as general purpose polymers such as polymethylmethacrylate (PMMA) and polystyrene (PS), polymer derivatives with phenol groups, acryl polymers, imide polymers, aryl ether polymers, amide polymers, fluorine polymers, p-xylene polymers, vinyl alcohol polymers, and blends thereof. In an embodiment, the first organic insulating layer 209 may include polyimide.

A contact metal CM may be formed on the first organic insulating layer 209. The contact metal CM may include a conductive material including Mo, Al, Cu, Ti, and the like, and may be formed in a multilayer or a single layer including the above material. The contact metal CM may include the same material as the source electrode SE or the drain electrode DE of the thin film transistor TFT. For example, the contact metal CM may be formed in a multilayer of Ti/Al/Ti.

A second organic insulating layer 211 may be formed on the contact metal CM. An upper surface of the second organic insulating layer 211 may include an approximately flat surface. the second organic insulating layer 211 may include organic insulating materials such as general purpose polymers such as polymethylmethacrylate (PMMA) and polystyrene (PS), polymer derivatives with phenol groups, acryl polymers, imide polymers, aryl ether polymers, amide polymers, fluorine polymers, p-xylene polymers, vinyl alcohol polymers, and blends thereof. In an embodiment, the second organic insulating layer 211 may include polyimide. An inorganic insulating layer may be further provided between the first organic insulating layer 209 and the second organic insulating layer 211.

A pixel electrode 221 may be formed on the second organic insulating layer 211. The pixel electrode 221 may include a conductive oxide such as an indium tin oxide (ITO), an indium zinc oxide (IZO), a zinc oxide (ZnO), an indium oxide ($In_2O_3$), an indium gallium oxide (IGO), or an aluminum zinc oxide (AZO). In an embodiment, the pixel electrode 221 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. In an embodiment, the pixel electrode 221 may further include a film formed of ITO, IZO, ZnO or $In_2O_3$ above/under the above-described reflective film.

A pixel definition layer 215 may be formed on the pixel electrode 221. The pixel definition layer 215 may include an opening 2150P that exposed an upper surface of the pixel electrode 221, and may cover an edge of the pixel electrode 221. The opening 2150P may defined a light-emitting area of light emitted from the organic light-emitting diode OLED. For example, the size/width of the opening 2150P may correspond to the size/width of the light-emitting area. Accordingly, the size and/or width of the pixel PX may depend on the size and/or width of the opening 2150P of the pixel definition layer 215 corresponding thereto.

The pixel definition layer 215 may include an organic insulating material. Alternatively, the pixel definition layer 215 may include an inorganic insulating material such as a silicon nitride, a silicon oxynitride, or a silicon oxide. Alternatively, the pixel definition layer 215 may include an organic insulating material and an inorganic insulating material.

An intermediate layer 222 may include a light-emitting layer 222b. The light-emitting layer 222b may include, for example, an organic material. The light-emitting layer 222b may include polymer or a low molecular weight organic material that emits light of a certain color. The intermediate layer 222 may include a first functional layer 222a disposed under the light-emitting layer 222b and/or a second functional layer 222c disposed above the light-emitting layer 222b.

The first functional layer 222a may be a single layer or multilayer. For example, when the first functional layer 222a includes a polymer material, the first functional layer 222a, as a hole transport layer (HTL) that is a single layer structure, may include poly-(3,4)-ethylene-dihydroxy thiophene (PEDOT) or polyaniline (PANI). When the first functional layer 222a includes a low molecular weight material, the first functional layer 222a may include a hole injection layer (HIL) and the HTL.

The second functional layer 222c may be optional and may therefore either be formed or omitted. For example, when the first functional layer 222a and the light-emitting layer 222b include a polymer material, the second functional layer 222c may be formed. The second functional layer 222c may be in a single layer or a multilayer. The second functional layer 222c may include an electron transport layer (ETL) and/or an electron injection layer (EIL).

The light-emitting layer 222b of the intermediate layer 222 may be disposed for each pixel PX in the display area DA of FIG. 1. The light-emitting layer 222b may be disposed to overlap the opening 2150P of the pixel definition layer 215, or/and the pixel electrode 221. The first and second functional layers 222a and 222c of the intermediate layer 222 may be formed throughout the display area DA as a single body.

A counter electrode 223 may include a conductive material having a low work function. For example, the counter electrode 223 may include a (semi-) transparent layer including Ag, Mg, Al, Pt, Pd, Au, Ni, Nd, Jr, Cr, lithium (Li), calcium (Ca), or an alloy thereof, and the like. Here, a low work function material may be understood to be any material having a work function within the range of those materials listed above or lower. Alternatively, the counter electrode 223 may further include a layer such as ITO, IZO, ZnO or $In_2O_3$ on the (semi-) transparent layer including the above-described material. The counter electrode 223, as a single body, may cover a plurality of pixel electrodes 221 in the display area DA. The intermediate layer 222 and the counter electrode 223 may be formed by a thermal evaporation method.

A spacer 217 may be formed on the pixel definition layer 215. The spacer 217 may include an organic insulating material such as polyimide. Alternatively, the spacer 217 may include an inorganic insulating material such as a silicon nitride or a silicon oxide, or an organic insulating material and an inorganic insulating material.

The spacer 217 may include a material different from the pixel definition layer 215. Alternatively, the spacer 217 may include the same material as the pixel definition layer 215. In this case, the pixel definition layer 215 and the spacer 217 may be formed together in a mask process using a halftone mask, and the like. In an embodiment, the pixel definition layer 215 and the spacer 217 may each include polyimide.

A capping layer 230 may be disposed above the counter electrode 223. The capping layer 230 may include LiF, an inorganic material, or/and an organic material. In an embodiment, the capping layer 230 may be omitted.

An encapsulation member covering the display layer 200 may be disposed above the display layer 200. For example, the encapsulation member may include at least one inorganic encapsulation layer and at least one organic encapsulation layer. The inorganic encapsulation layer may include an inorganic insulating material such as a silicon oxide ($SiO_2$), a silicon nitride ($SiN_x$), and the like, and the organic encapsulation layer may include a polymer-based material. The polymer-based material may include acryl resin, epoxy resin, polyimide, polyethylene, and the like.

Figure 5:
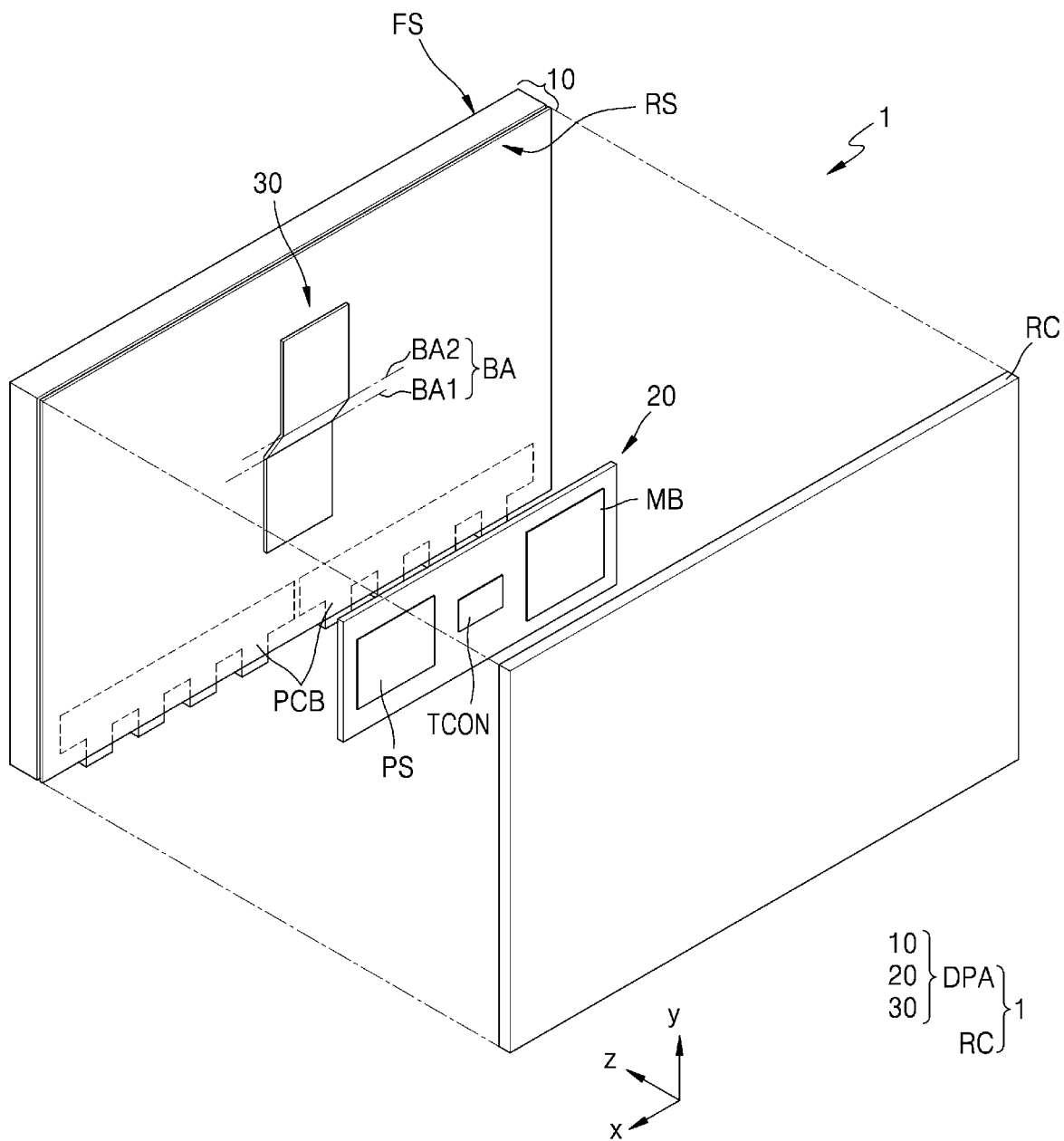
FIG. 5 is a schematic exploded perspective view illustrating an electronic device according to an embodiment of the present disclosure.

FIG. 5 is a schematic exploded perspective view of an electronic device according to an embodiment.

Referring to FIG. 5, the electronic device 1 may include a display apparatus DPA and a rear cover RC. The display apparatus DPA may include the display panel module 10, a control module 20, and a heat dissipation member 30.

As the display panel module 10 is described above with reference to FIG. 3, to the extent that a detailed description of an element is omitted, it may be assumed that the description is at least similar to that of corresponding elements that are described elsewhere in the specification. The display panel module 10 may include a front surface FS displaying an image and a rear surface RS opposite to the front surface FS. In an example, the front surface FS of the display panel module 10 may be the first surface S1 of FIG. 3 of the display panel 11 of FIG. 3, and the rear surface RS may be one surface of the lower cover 12 of FIG. 3. In an example, when the display panel module 10 does not include the lower cover 12 and the first heat transfer sheet 13 of FIG. 3 (e.g., the lower cover 12 and the first heat transfer sheet 13 are omitted), the rear surface RS of the display panel module 10 may be the second surface S2 of FIG. 3 of the display panel 11. For the convenience of explanation, a case in which the rear surface RS of the display panel module 10 is one surface of the lower cover 12 is described below.

The control module 20 may be disposed on the rear surface RS of the display panel module 10. The control module 20, as an external control device, may be electrically connected to the display panel module 10 through the printed circuit board PCB. The control module 20 may include a power supply portion PS, a mainboard MB, and a timing controller TCON. For example, the power supply portion PS, the mainboard MB, and the timing controller TCON may be mounted on a circuit board of the control module 20. The power supply portion PS may supply power from an external source to the mainboard MB and the display panel module 10 according to user's control. The mainboard MB may perform a function of controlling an overall operation of the electronic device 1, and may include constituent elements, for example, a CPU, a memory, a processor, and the like. The timing controller TCON may generate a timing signal needed for control of the display panel module 10.

The heat dissipation member 30 may be disposed on the rear surface RS of the display panel module 10. The heat dissipation member 30 may be disposed between the display panel module 10 and the rear cover RC that is described later. A portion of the heat dissipation member 30 may be in contact with the display panel module 10, and the other portion of the heat dissipation member 30 may be spaced apart from the display panel module 10. To this end, at least a part of the heat dissipation member 30 may be bent. For example, as illustrated in FIG. 5, the heat dissipation member 30 may be bent with respect to a bending axis BA that is parallel to the rear surface RS of the display panel module 10. For example, the bending axis BA may include a first bending axis BA1 and a second bending axis BA2, which extend in ±x directions and run parallel to each other.

In an embodiment, the other portion of the heat dissipation member 30 may be in contact with the rear cover RC. In an embodiment, the other portion of the heat dissipation member 30 may be spaced apart from the rear cover RC so that air may be provided between the other portion and the rear cover RC. In an embodiment, the other portion of the heat dissipation member 30 may be in contact with a separate constituent element, for example, a cooling plate having a temperature lower than that of the display panel module 10. However, for the convenience of explanation, a case in which the other portion of the heat dissipation member 30 is in contact with the rear cover RC is described below.

The heat dissipation member 30 has a superior heat transfer characteristic to that of the other elements described herein, and may transfer heat generated from the display panel module 10 to the rear cover RC, for example.

The rear cover RC is located at the rear of the display panel module 10, and may be arranged apart from the display panel module 10. Accordingly, the control module 20 may be disposed between the display panel module 10 and the rear cover RC. The rear cover RC may entirely cover at least the control module 20, and may protect the control module 20. The rear cover RC may include a metal material or a plastic material having a desired strength and thermal conductivity. For example, the rear cover RC may be the outmost constituent element exposed to the outside of the electronic device 1.

Figure 6A:
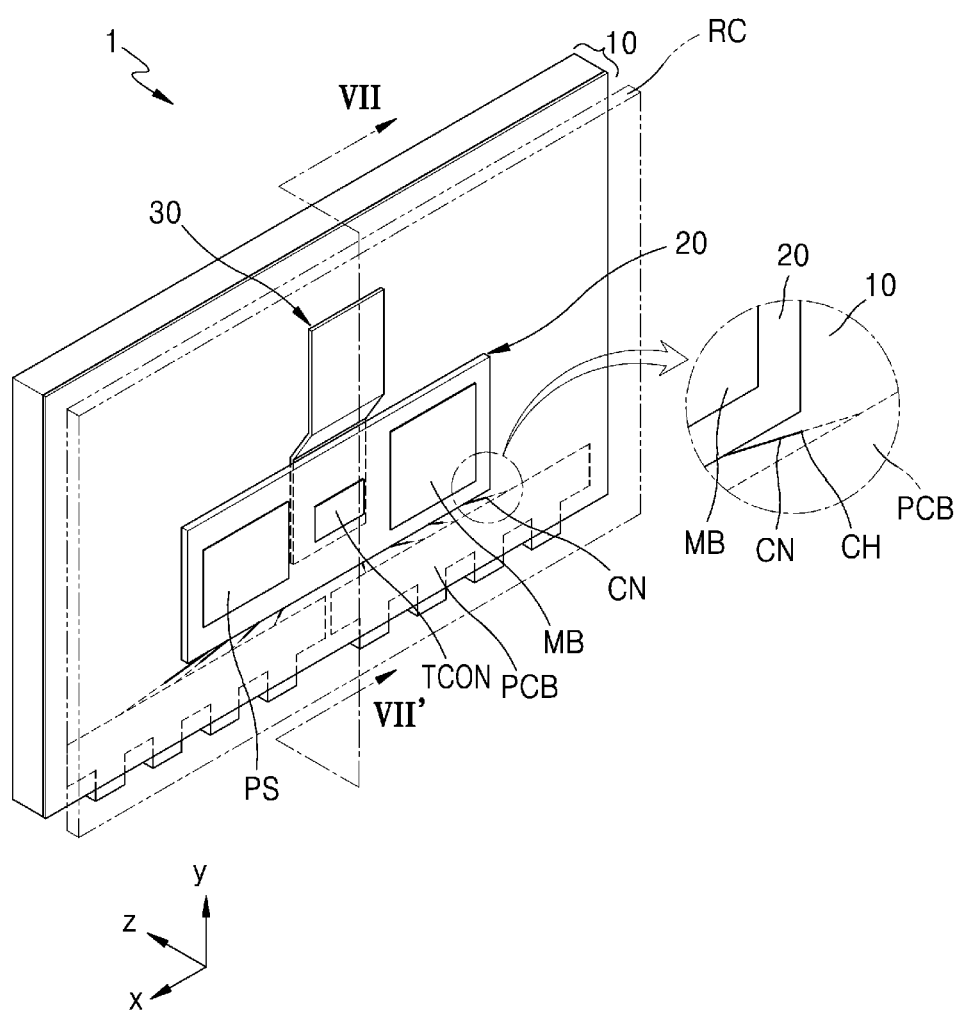
FIGS. 6A and 6B are schematic perspective views illustrating electronic devices according to embodiments of the present disclosure.
Figure 6B:
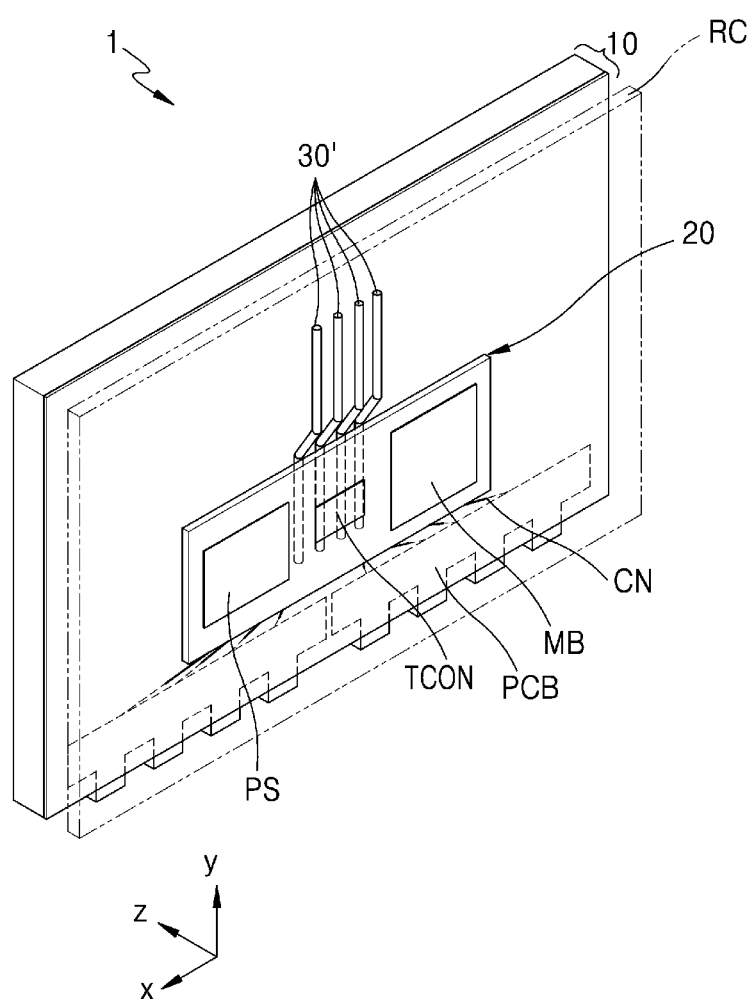

FIGS. 6A and 6B area schematic perspective views of electronic devices according to embodiments. FIGS. 6A and 6B illustrate state in which the respective constituent elements of the electronic device 1 are assembled.

First, referring to FIG. 6A, the control module 20 may be disposed between the display panel module 10 and the rear cover RC, and may overlap at least a part of the display panel module 10. The control module 20 may be electrically connected to the printed circuit board PCB through the connectors CN, and may apply a control signal, and the like to the printed circuit board PCB. The connector CN may connect the control module 20 to the printed circuit board PCB via a connector hole CH formed in the lower cover 12 of FIG. 3 of the display panel module 10. The printed circuit board PCB may transmit an applied control signal, and the like to the driving circuit portion DR of FIG. 3, and the driving circuit portion DR may apply an electrical signal to the display panel module 10.

The heat dissipation member 30 may be disposed between the display panel module 10 and the rear cover RC, and at least a part of the heat dissipation member 30 may be disposed between the display panel module 10 and the control module 20. Accordingly, the at least a part of the heat dissipation member 30 may be disposed to overlap the control module 20 and the display panel module 10.

The other portion of heat dissipation member 30 might not overlap the control module 20. To this end, the heat dissipation member 30 may extend in a first direction. For example, the heat dissipation member 30 may extend in ±y directions of FIG. 6A, and the extension length of the heat dissipation member 30 in the ±y directions may be greater than the length of the control module 20 in the ±y directions.

In FIG. 6A, the width of the heat dissipation member 30 in the ±x directions is less than the width of the control module 20 in the ±x directions. The disclosure is not necessarily limited thereto, and the width of the heat dissipation member 30 may be greater than or equal to the width of the control module 20. However, for the convenience of explanation, a case in which the width of the heat dissipation member 30 is less than the width of the control module 20 is described.

In an embodiment, the heat dissipation member 30 may overlap the timing controller TCON provided in the control module 20. For example, the at least a part of the heat dissipation member 30 may entirely overlap the timing controller TCON. The disclosure is not necessarily limited thereto, and the at least a part of the heat dissipation member 30 may entirely or partially overlap the power supply portion PS or the mainboard MB.

As illustrated in FIG. 6A, in an embodiment, the heat dissipation member 30 may be provided in a plate shape having a width and a length relatively greater than a thickness. The thickness may be, for example, a length of the heat dissipation member 30 in ±z directions. As the heat dissipation member 30 performs a function of transferring heat between the display panel module 10 and the rear cover RC, a contact area between the display panel module 10 and the rear cover RC may be sufficiently secured. However, to reduce the thickness of the display apparatus DPA, an interval between the display panel module 10 and the rear cover RC may be considerably small, and accordingly, the heat dissipation member 30 may have a thickness less than the interval. Consequently, the heat dissipation member 30 has a small thickness, and may have a length and a width relatively greater than the thickness to have a larger contact area.

Although FIG. 6A illustrates that the heat dissipation member 30 has a generally rectangular shape on a plane, the disclosure is not necessarily limited thereto. The heat dissipation member 30 may have a shape on a plane, for example, a polygon such as a triangle, a pentagon, and the like, a polygon with round corners, a circle, an oval, and the like. Furthermore, in an embodiment, the heat dissipation member 30 may be of a mesh type including a plurality of openings.

Referring to FIG. 6B, in an embodiment, a heat dissipation member 30' may be provided in the form of a pipe and may include a plurality of pipes. For example, the heat dissipation member 30' may be elongated in the first direction, and may have a circular or oval shape on a cross-section perpendicular to the first direction. In this case, the diameter of the circle or the length of the major side of the oval may be relatively less than the extension length of the heat dissipation member 30'. Although the heat dissipation member 30' is described to be of a 'pipe' type, the disclosure is not necessarily limited thereto, and the shape of the cross-section of the heat dissipation member 30' may be a polygon such as a triangle, a rectangle, and the like, a polygon with round corners, and the like. However, even in this case, the width of the heat dissipation member 30' may be relatively greater than the extension length of the heat dissipation member 30'.

In some embodiments, the electronic device 1 may include various constituent elements and wirings arranged around the control module 20. In this case, when the heat dissipation member 30' has a large area, interference with the constituent elements and wirings may occur, and accordingly the arrangement of the heat dissipation member 30' may be difficult.

However, according to an embodiment, as the heat dissipation member 30' has a diameter (the length, width, or thickness of the major side) relatively less than the extension length thereof, without interference with the constituent elements and wirings, the heat dissipation member 30' may be arranged to reduce space usage. Furthermore, a plurality of heat dissipation members may be arranged as the heat dissipation member 30'. Accordingly, a decrease in the heat conductivity efficiency because a contact area between the heat dissipation member 30' and the display panel module 10 or the rear cover RC may be compensated for.

Figure 7:
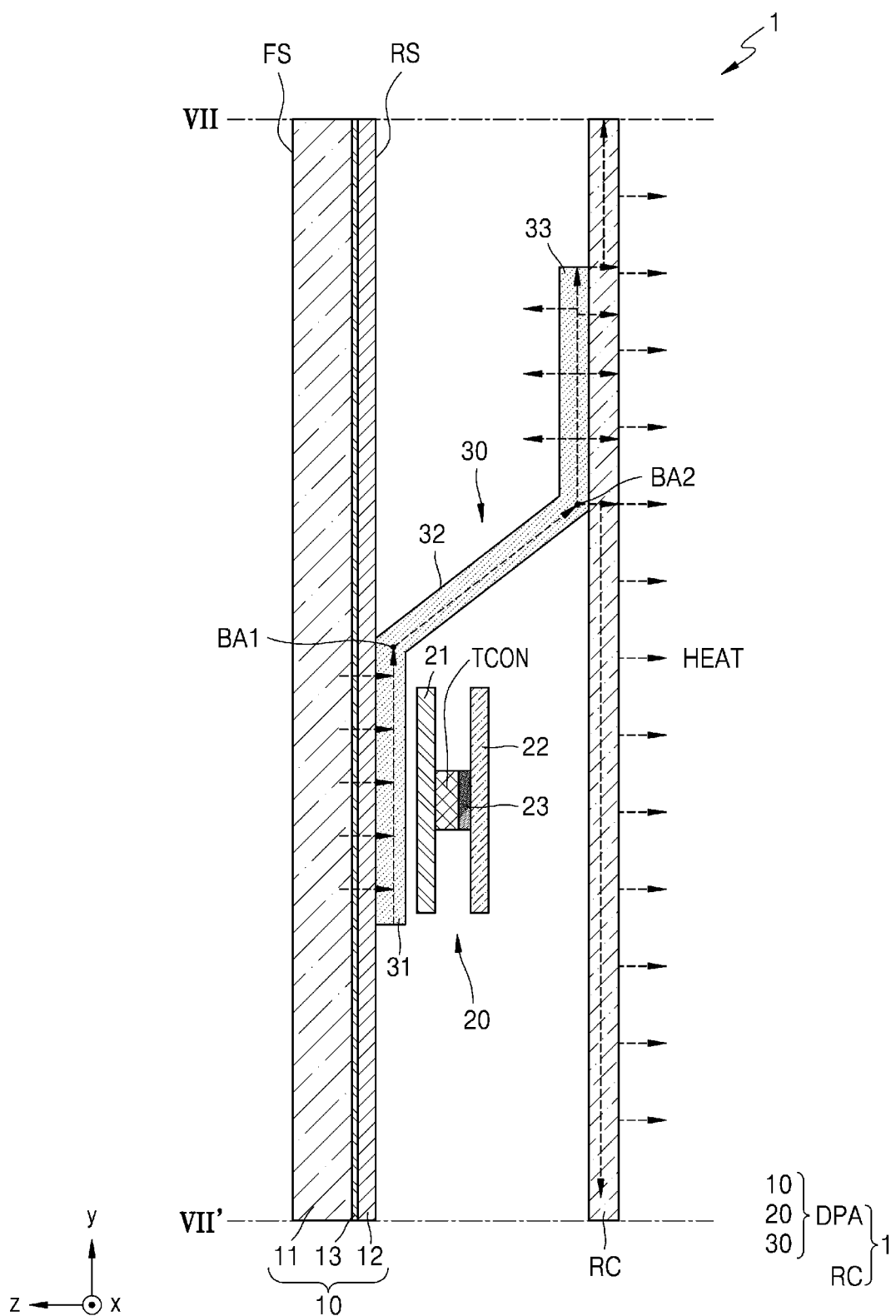
FIG. 7 is a schematic cross-sectional view illustrating a portion of an electronic device according to an embodiment of the present disclosure.

FIG. 7 is a schematic cross-sectional view of an electronic device according to an embodiment. FIG. 7 may correspond to a cross-section of the electronic device 1 taken along line VII-VII' of FIG. 6A. Constituent elements that are identical to or correspond to the constituent elements described above with reference to FIGS. 1 to 6B are given like reference numerals, and to the extent that a detailed description of an element is omitted, it may be assumed that the description is at least similar to that of corresponding elements that are described elsewhere in the specification.

Referring to FIG. 7, the display panel module 10 may emit light through the front surface FS and thereby display an image. One surface of the display panel module 10 facing in the +z direction may be the front surface FS. The display panel module 10 may include the rear surface RS opposite to the front surface FS, and the rear surface RS may be a surface through which no light is emitted.

The heat dissipation member 30 may be disposed on the rear surface RS of the display panel module 10. The heat dissipation member 30 may include a first portion 31, a second portion 33, and a first connection portion 32 connecting the first portion 31 to the second portion 33. Each of the first portion 31, the second portion 33, and the first connection portion 32 may be formed as a single body (e.g., a contiguous structure).

The first portion 31 of the heat dissipation member 30 may be in contact with the display panel module 10, for example, the rear surface RS of the display panel module 10. The second portion 33 of the heat dissipation member 30 may be farther apart from the display panel module 10 than the first portion 31 is. In an embodiment, the second portion 33 may be in contact with the rear cover RC. As described herein, it will be understood that when a layer, region, or component is referred to as being "in contact with" another layer, region, or component, it can be in direct contact with the other layer, region, or component or in indirect contact with the other layer, region, or component via intervening layers, regions, or components to be capable of thermal conductivity.

The first portion 31 and the second portion 33 each may have flat contact surfaces. A contact area between the first portion 31 and the display panel module 10 may be the same as or different from a contact area between the second portion 33 and the rear cover RC. The first portion 31 and the second portion 33 may be substantially parallel to each other.

As described above, as the display panel module 10 and the rear cover RC are spaced apart from each other. In order for the heat dissipation member 30 to be in contact with both of the display panel module 10 and the rear cover RC, at least one portion may be bent. For example, the heat dissipation member 30 may include at least one portion that is bent between the first portion 31 and the second portion 33. FIG. 7 illustrates, for example, that the heat dissipation member 30 is bent with respect to the first bending axis BA1 at a portion where the first portion 31 and the first connection portion 32 are connected and is bent with respect to the second bending axis BA2 at a portion where the second portion 33 and the first connection portion 32 are connected. The first bending axis BA1 and the second bending axis BA2 may be parallel to the rear surface RS, for example, parallel to the x-axis. In an example, the first connection portion 32 is smoothly bent so that the heat dissipation member 30 may have an "S" shape. In this case, the bending axis that is a center of bending of the first connection portion 32 may be parallel to the rear surface RS.

The control module 20 is disposed on the rear surface RS of the display panel module 10 and is spaced apart from the display panel module 10. The control module 20 may be spaced apart from the display panel module 10 through a support member such as a stud, and the like. The first portion 31 of the heat dissipation member 30 may be disposed between the display panel module 10 and the control module 20 and may at least partially overlap the display panel module 10 and the control module 20.

The control module 20 may include a circuit substrate 21 and a shield member 22. The supply portion PS, the mainboard BS, and the timing controller TCON, which are described above with reference to FIG. 5, may be mounted on the circuit substrate 21, and the shield member 22 may be disposed on the circuit substrate 21. The shield member 22 may cover electronic devices mounted on the circuit substrate 21, for example, the power supply portion PS, the mainboard BS, and the timing controller TCON. The shield member 22, as a conductive film, may include a conductive material. In an embodiment, the shield member 22 may be a metal film including a metal material having a high degree of electrical conductivity such as copper.

Electronic devices such as the timing controller TCON, and the like may be operated by a high frequency signal, and electronic waves or static electricity may be generated by the high frequency signal. The electronic waves or static electricity may interfere with an electrical signal transmitted to the display panel module 10 and may travel outside of the electronic device 1 to generate malfunctions of peripheral devices. To reduce such a problem, the shield member 22 may cover the electronic devices on the circuit substrate 21. The shield member 22 may reduce adverse effects and problems due to electronic wave interference, static electricity interference, and the like, and may make the electronic device 1 more reliable.

The control module 20 may include a first thermal interface material (TIM) 23 provided between the electronic devices mounted on the circuit substrate 21 and the shield member 22. For example, the first TIM 23 may be disposed between the timing controller TCON and the shield member 22. The first TIM 23 may perform a function of reducing contact resistance between the electronic devices and the shield member 22 and increasing thermal conductivity. The first TIM 23 may conductively transfer the heat generated from the electronic devices to the shield member 22 and may facilitate heat dissipation. The first TIM 23 may include, for example, a silicon-based elastic body or silicon-based grease.

During the operation of the display panel 11, the display panel 11 may dissipate not only light, but also heat. For example, the light-emitting element of the display panel 11 may generate heat with light, and as a currents flow various wirings of the display panel 11, heat may be generated due to resistance of the wirings. Such heat may be dissipated to surrounding environment through convection and radiation from, for example, the front surface and/or the rear surface of the display panel 11.

When the electronic device 1 is used for a long time and the heat generated from the display panel 11 is not sufficiently dissipated, the temperature of the display panel 11 may be increased. When the display panel 11 is continuously maintained at a high temperature, degradation of the elements (e.g., light-emitting elements) included in the display panel 11 may be promoted. Accordingly, the quality and life of the electronic device 1 may deteriorate. Furthermore, when the heat from the display panel 11 is not dissipated generally uniformly, heat may be accumulated in a partial area of the display panel 11 so that a high temperature may be continuously maintained and degradation of elements disposed in the partial area may be promoted due to the high temperature. This may cause a latent image to be displayed, the quality of the electronic device 1 may be reduced, and the lifespan of the electronic device 1 may also be shortened.

In a comparative example, a display apparatus may include a display panel and a control module arranged spaced apart from each other, but might not include a heat transfer member. As the control module overlaps a partial area of the display panel, the control module may prevent the dissipation of the heat generated from the partial area of the display panel through convection and radiation. Consequently, as the heat dissipation is not smoothly performed in the partial area of the display panel, a high temperature may persist, and thus the above-described problems may be generated.

According to an embodiment, the above-described heat dissipation member 30 is provided, which may transfer the heat of the display panel 11 generated in an area where the display panel 11 overlaps the control module 20 (hereinafter, referred to as the overlap area) to a portion where the temperature is lower than the display panel 11, for example, the rear cover RC. In this regard, FIG. 7 illustrates a path in the heat dissipation member 30 indicated by a dashed arrow, along which the heat generated from the overlap area of the display panel 11 is transferred to the rear cover RC.

As the first portion 31 of the heat dissipation member 30 contacts the display panel module 10 in the overlap area, the heat of the display panel 11 generated in the overlap area may be absorbed in the first portion 31. The absorbed heat may be transferred from the first portion 31 of the heat dissipation member 30 to the second portion 33. As the second portion 33 contacts the rear cover RC, the absorbed heat may be consequently transferred to the rear cover RC. The rear cover RC, which is a constituent element arranged at the outermost side of the electronic device 1, may directly contact the surrounding environment having a relatively low temperature. Accordingly, the heat may be effectively dissipated from the surface of the rear cover RC through radiation and convection. Consequently, the heat generated from the overlap area of the display panel module 10 is effectively dissipated, and thus the temperature increase in the overlap area may be reduced, and fast degradation of the elements of the display panel module 10 arranged in the overlap area may be prevented. Furthermore, the quality and lifespan of the electronic device 1 may be increased.

The timing controller TCON of the control module 20 may be a highly integrated electronic device, which may generate considerable heat. Accordingly, a high temperature phenomenon may be the most severe in an area of the display panel 11 overlapping the timing controller TCOM. To effectively address the above issue, in an embodiment, the heat dissipation member 30 may be disposed to cover at least the timing controller TCON.

Figure 8:
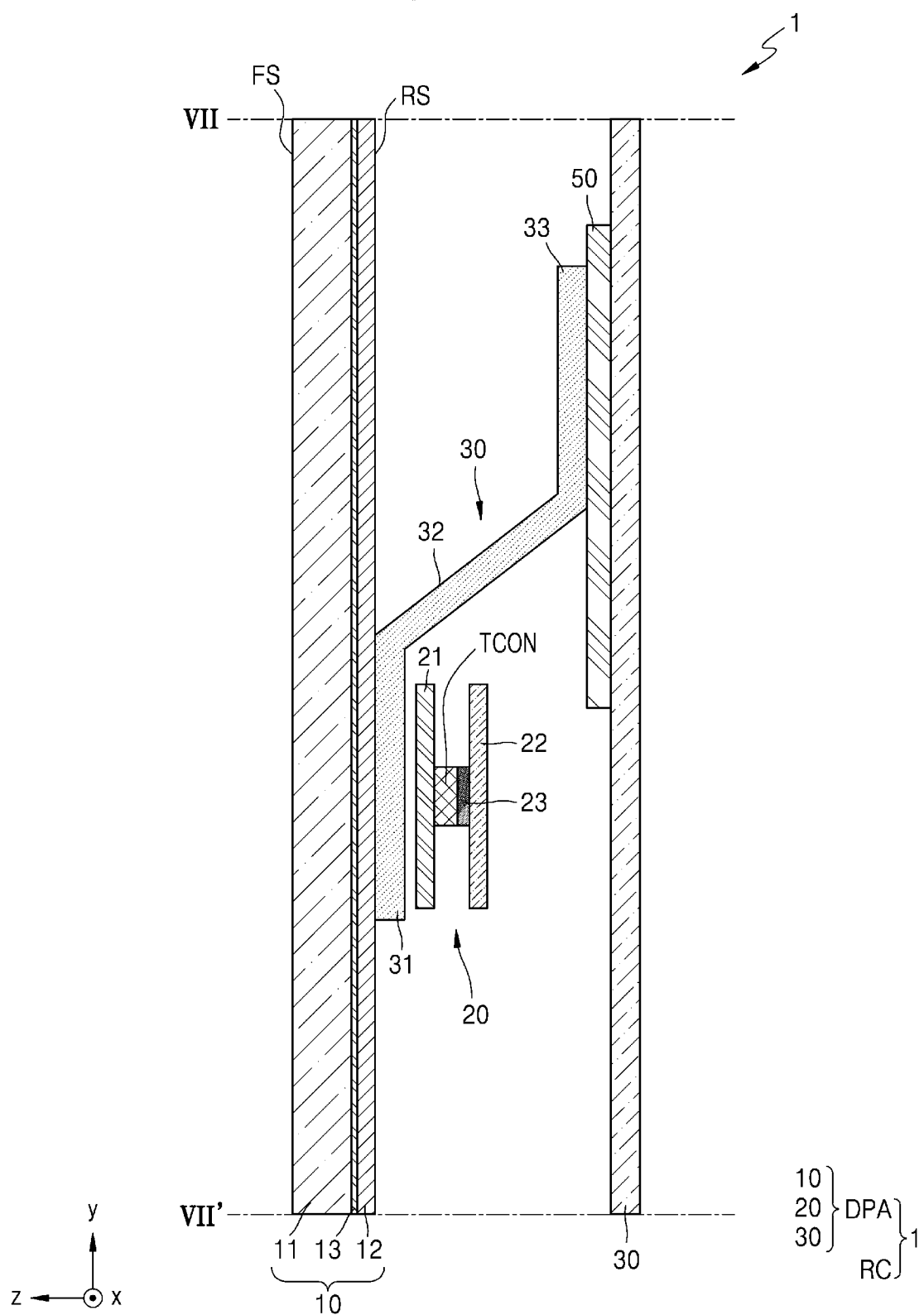
FIG. 8 is a schematic cross-sectional view illustrating a portion of an electronic device according to an embodiment of the present disclosure.

FIG. 8 is a schematic cross-sectional view of a portion of an electronic device according to an embodiment. To the extent that a detailed description of an element is omitted, it may be assumed that the description is at least similar to that of corresponding elements that are described elsewhere in the specification.

Referring to FIG. 8, the electronic device 1 may include an intermediate member 50 disposed between the second portion 33 of the heat dissipation member 30 and the rear cover RC. In an example, the intermediate member 50 may be a second heat transfer sheet. The second heat transfer sheet may diffuse the heat received from the heat dissipation member 30 to area region with a larger area. On a plan viewed in a direction perpendicular to the rear surface RS of the display panel module 10, the area of the second heat transfer sheet may be greater than the area of the second portion 33 of the heat dissipation member 30. Accordingly, the heat may be effectively dissipated. The second heat transfer sheet may include a material having a superior thermal conductivity, for example, graphite, silicon resin, acryl resin, urethane resin, and the like.

In an example, the intermediate member 50 may be a second thermal interface material. The second thermal interface material may perform a function of reducing contact resistance between the heat dissipation member 30 and the rear cover RC and increasing thermal conductivity. The second thermal interface material may include, for example, silicon-based elastic body or silicon-based grease.

Figure 9:
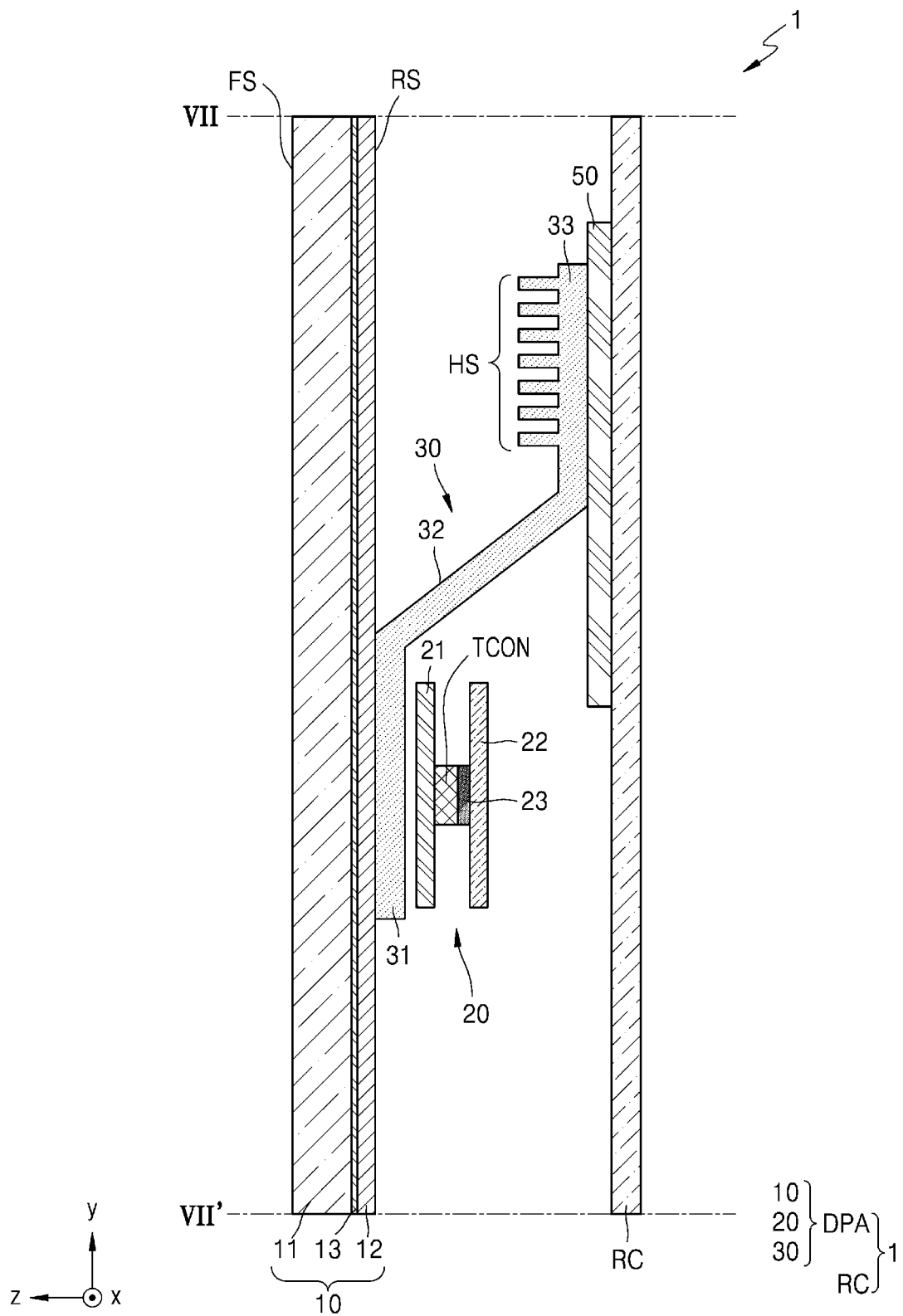
FIG. 9 is a schematic cross-sectional view illustrating a portion of an electronic device according to an embodiment of the present disclosure.

FIG. 9 is a schematic cross-sectional view of a portion of an electronic device according to an embodiment. To the extent that a detailed description of an element is omitted, it may be assumed that the description is at least similar to that of corresponding elements that are described elsewhere in the specification.

Referring to FIG. 9, the second portion 33 of the heat dissipation member 30 of the electronic device 1 may include one surface facing the display panel module 10 and a heat sink HS formed on the one surface. The one surface of the second portion 33 where the heat sink HS is formed may be a surface opposite to a surface contacting the rear cover RC. The heat sink HS may absorb heat from the second portion 33 of the heat dissipation member 30 and diffuse the heat to the ambient air having a relatively low temperature. Accordingly, the heat dissipation member 30 may more effectively dissipate the heat of the display panel module 10.

The heat sink HS may include, for example, a plurality of fins. The fins may increase a contact area with ambient air so that heat transfer by convection may be effectively performed. The fins may protrude from the second portion 33.

Figure 10:
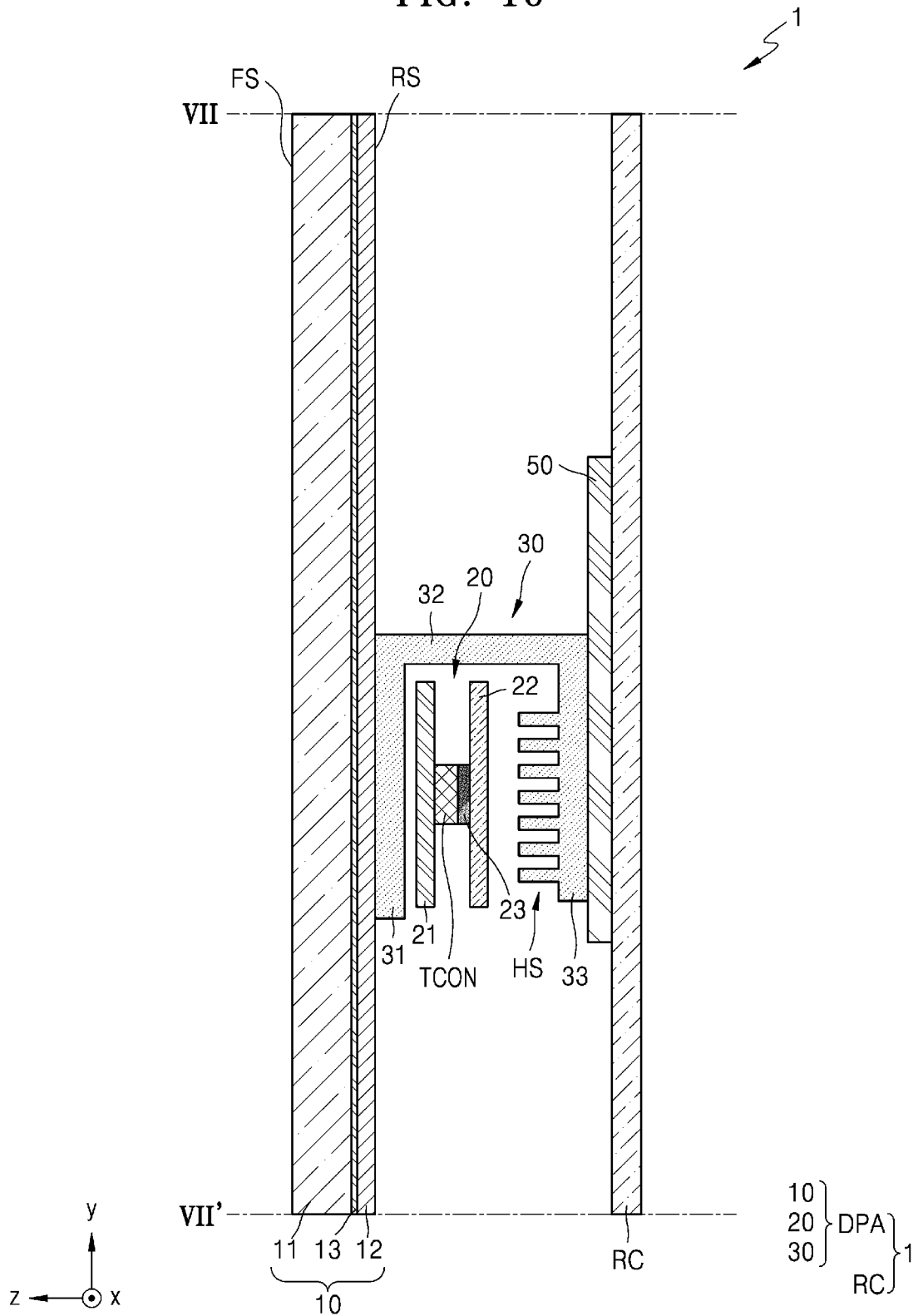
FIG. 10 is a schematic cross-sectional view illustrating a portion of an electronic device according to an embodiment of the present disclosure.

FIG. 10 is a schematic cross-sectional view of a portion of an electronic device according to an embodiment. To the extent that a detailed description of an element is omitted, it may be assumed that the description is at least similar to that of corresponding elements that are described elsewhere in the specification.

Referring to FIG. 10, the heat dissipation member 30 of the electronic device 1 may be bent so that the first portion 31 and the second portion 33 may overlap the control module 20. For example, the heat dissipation member 30 may be bent likes a horseshoe shape. The structure of the heat dissipation member 30 may reduce the area of the heat dissipation member 30 on a plane, and may arrange other constituent elements in an area where the heat dissipation member 30 is not disposed.

Figure 11:
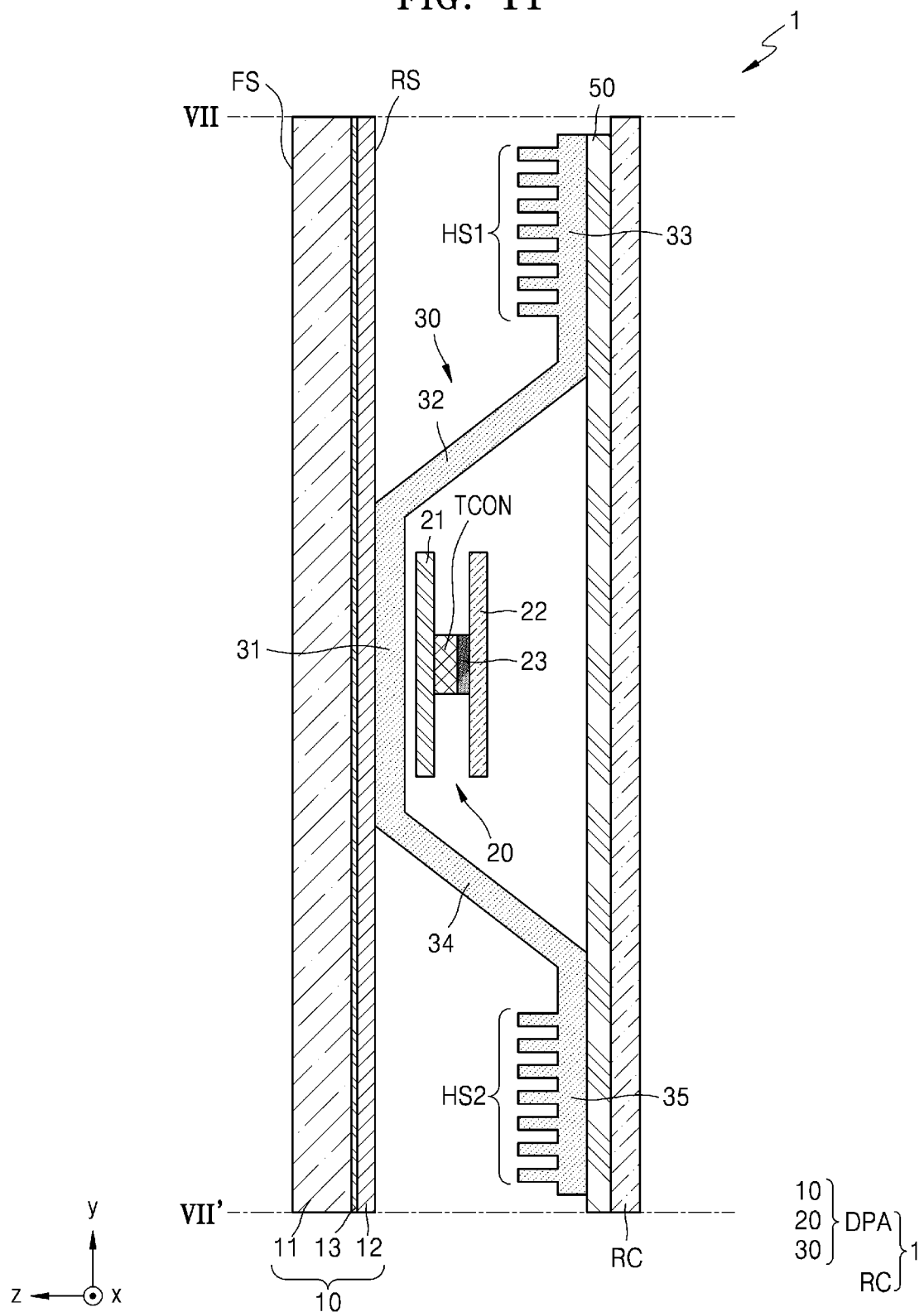
FIG. 11 is a schematic cross-sectional view illustrating a portion of an electronic device according to an embodiment of the present disclosure.

FIG. 11 is a schematic cross-sectional view of a portion of an electronic device according to an embodiment. To the extent that a detailed description of an element is omitted, it may be assumed that the description is at least similar to that of corresponding elements that are described elsewhere in the specification.

Referring to FIG. 11, the heat dissipation member 30 of the electronic device 1 may further include a third portion 35 in contact with the rear cover RC and disposed at the opposite side of the second portion 33 with respect to the first portion 31 and a second connection portion 34 connecting the first portion 31 and the third portion 35. Like the second portion 33, the third portion 35 may be a portion farther apart from the display panel module 10 than the first portion 31 is. The first to third portions 31, 33, and 35 and the first and second connection portions 32 and 34 of the heat dissipation member 30 are all formed as a single body.

The heat dissipation member 30 may increase a contact area with the rear cover RC and a heat transfer rate from the display panel 11 to the rear cover RC. Accordingly, the heat dissipation member 30 may more effectively dissipate the heat of the display panel module 10.

In an embodiment, the second portion 33 and the third portion 35 each may include a first heat sink HS1 and a second heat sink HS2. The first and second heat sinks HS1 and HS2 may be respectively formed surfaces of the second and third portions 33 and 35 facing the display panel module 10. As the heat dissipation member 30 increases a contact area with ambient air, the heat of the display panel module 10 may be more effectively dissipated.

Figure 12:
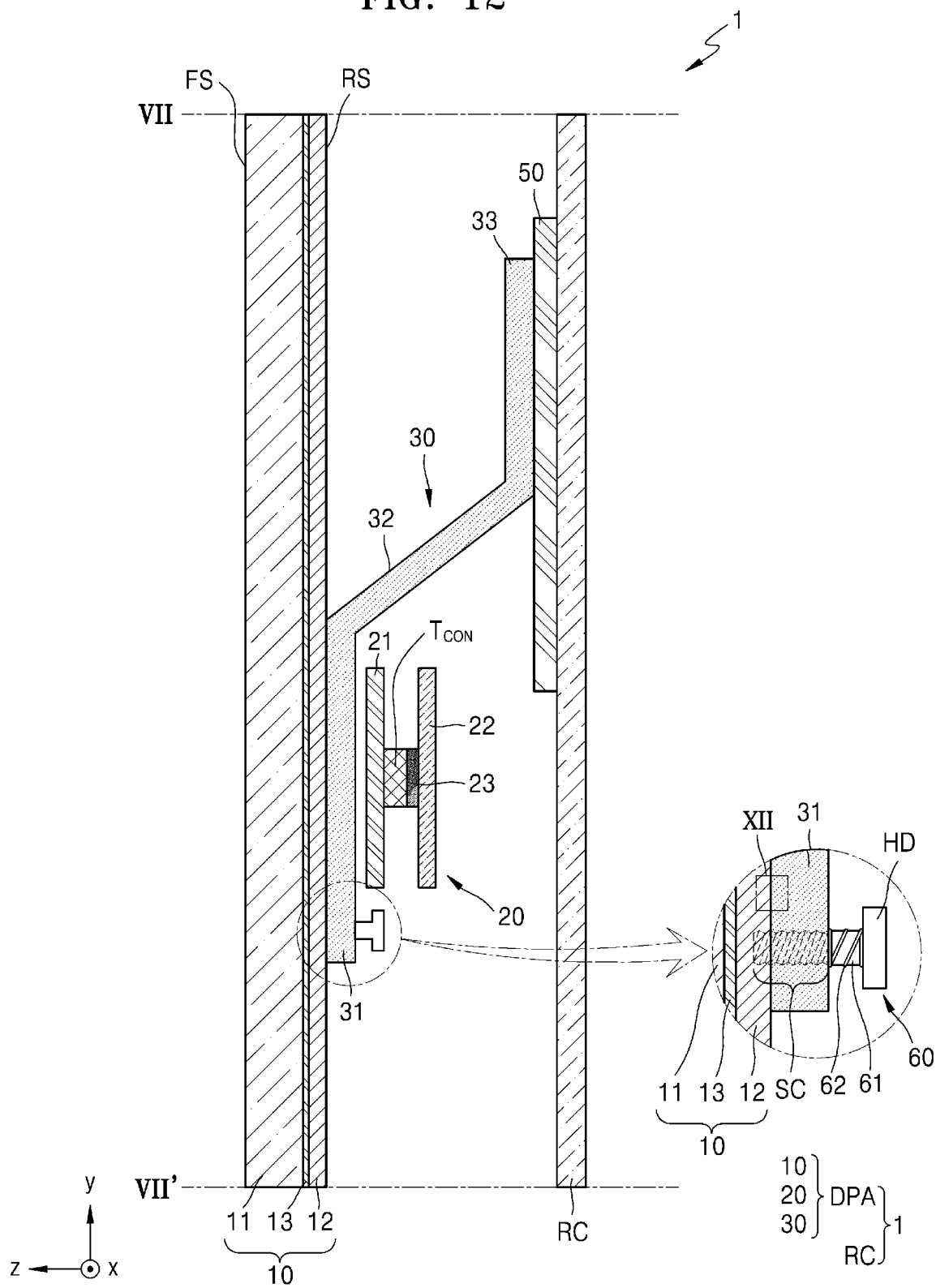
FIG. 12 is a schematic cross-sectional view illustrating a portion of an electronic device according to an embodiment of the present disclosure.

FIG. 12 is a schematic cross-sectional view of a portion of an electronic device according to an embodiment. To the extent that a detailed description of an element is omitted, it may be assumed that the description is at least similar to that of corresponding elements that are described elsewhere in the specification.

Referring to FIG. 12, the electronic device 1 may further include a pressing member 60 that applies a pressure to allow the heat dissipation member 30 and the display panel module 10 to be pressed close to each other (for example, in contact with one another).

In an embodiment, the pressing member 60 may include a main body portion 61 and an elastic portion 62. The main body portion 61 may include a head HD disposed at one side and a screw portion SC disposed at the other side. The diameter of the head HD may be greater than the diameter of the screw portion SC. The main body portion 61 may penetrate the heat dissipation member 30, and may be screw-coupled to one portion of the display panel module 10, for example, one portion of the lower cover 12, via the screw portion SC.

The elastic portion 62 may be disposed between the head HD of the main body portion 61 and the first portion 31 of the heat dissipation member 30. The elastic portion 62 may be elastically deformable. The elastic portion 62 may include, for example, a compression spring, a spring washer, and the like. As the main body portion 61 is coupled closer to the display panel module 10, a separation distance between the head HD and the first portion 31 may be decreased and the elastic portion 62 may be compression-deformed. The elastic portion 62 may apply a pressure in both directions in response to compression deformation so that the head HD and the first portion 31 are away from each other, and thus the elastic portion 62 may apply a pressure toward the display panel module 10 to the first portion 31 so that the first portion 31 closely contacts the display panel module 10.

The pressing member 60 may include one or two more pressing members. The pressing member 60 may overlap or might not overlap the control module 20. The embodiment of the above-described pressing member 60 is an example, and any configuration capable of allowing the first portion 31 of the heat dissipation member 30 and the display panel module 10 to closely contact each other may be employed as the pressing member 60.

Figure 13:
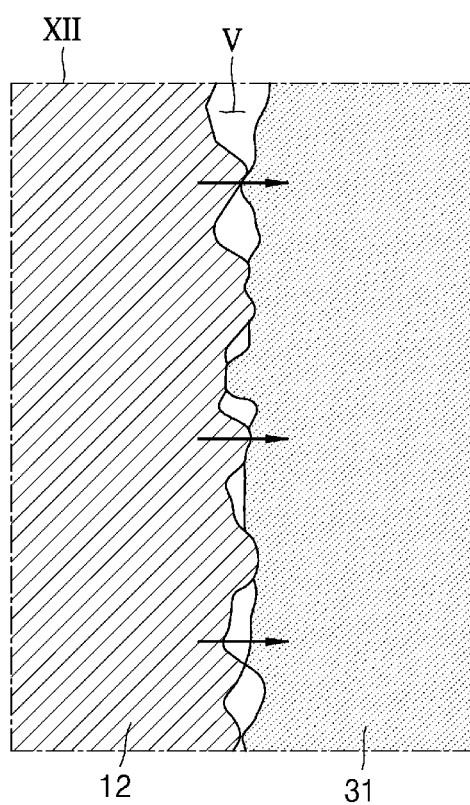
FIG. 13 is an enlarged schematic cross-sectional view illustrating a portion of the electronic device of FIG. 12.

According to an embodiment, as the pressing member 60 allows the heat dissipation member 30 and the display panel module 10 to closely contact each other, heat resistance between the heat dissipation member 30 and the display panel module 10 may be decreased. The heat resistance means the heat conduction prevention characteristics. The heat generated from the display panel module 10 is transferred to the heat dissipation member 30, and in this time, as the heat resistance decreases, heat conductivity is increased, and dissipation from the display panel module 10 to the heat dissipation member 30 is effectively performed. Referring to FIG. 13, the heat resistance is described below in detail.

FIG. 13 is an enlarged schematic cross-sectional view of one portion of the electronic device of FIG. 12. FIG. 13 may correspond to a portion XII of the electronic device of FIG. 12.

Referring to FIG. 13, a large number of gaps V may exist in a contact surface between the lower cover 12 of the display panel module 10 of FIG. 12 and the first portion 31 of the heat dissipation member 30 of FIG. 12. An area where the lower cover 12 and the first portion 31 actually contact each other is decreased by the gap V, and thus heat conductivity between the lower cover 12 and the first portion 31 is decreased. Furthermore, in most cases, an air layer is formed in the gap V, and the air layer causes a decrease in the heat conductivity. Consequently, the more the gaps V in a contact surface of two objects, the great the heat resistance between the two objects.

As described above with reference to FIG. 12, as the pressing member 60 of FIG. 12 allows the heat dissipation member 30 and the display panel module 10 to closely contact each other, the gaps V formed in a contact surface between the heat dissipation member 30 and the display panel module 10 may be decreased. For example, the heat resistance may be reduced, and the heat conductivity may be increased.

Figure 14:
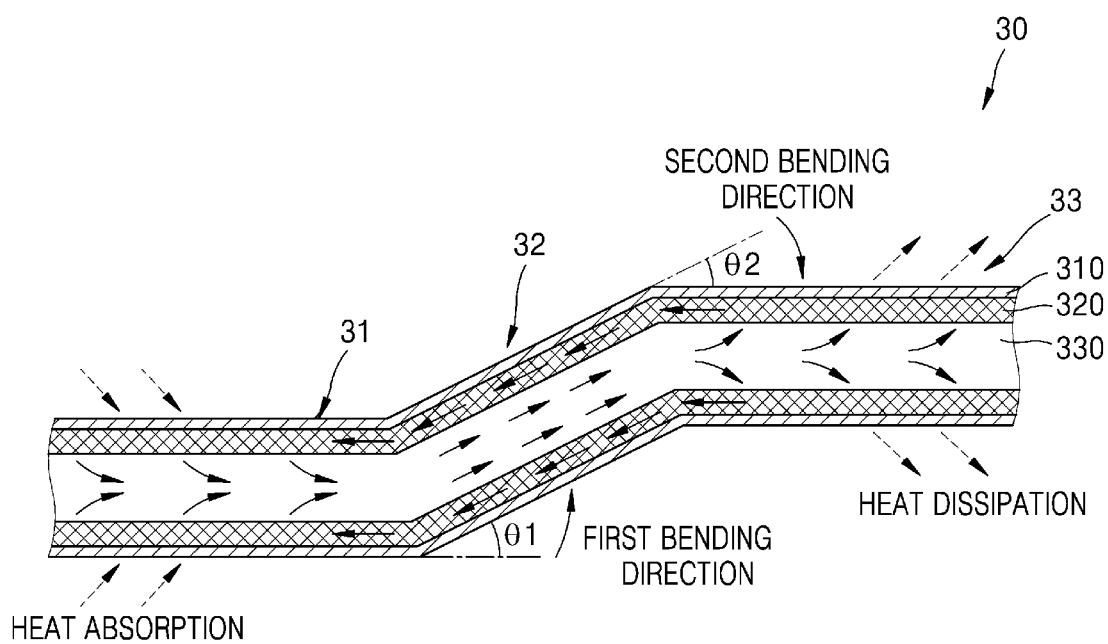
FIG. 14 is a schematic cross-sectional view illustrating a heat dissipation member provided in an electronic device according to an embodiment of the present disclosure.

FIG. 14 is a schematic cross-sectional view of the heat dissipation member 30 provided in an electronic device according to an embodiment.

Referring to FIG. 14, the heat dissipation member 30 may include a container 310 including a material having a high thermal conductivity, a moisture absorption layer 320 located in an inner wall of the container 310, and a vapor channel 330 in the moisture absorption layer 320. An operating fluid may exist in the container 310. The vapor channel 330 is a path through which the operating fluid in a vapor state may flow.

The container 310 may include a metal having a high thermal conductivity such as aluminum, copper, silver, titanium, chromium, nickel, iron, platinum, and the like. The moisture absorption layer 320 may include a porous structure such as a capillary structure. The operating fluid may include, for example, helium, ammonia, Freon, water, alcohols such as methanol or ethanol, and the like.

In an embodiment, the heat dissipation member 30 may be a plate-type vapor chamber or a pipe-type heat pipe.

The operating principle of the heat dissipation member 30 is described below. First, when the first portion 31 of the heat dissipation member 30 absorbs heat from a heat source, the operating fluid in a liquid state in the container 310 is vaporized by the heat. The vapor may flow to the second portion 33 having a relatively low pressure through the vapor channel 330. The vapor may dissipate heat in the second portion 33 to be condensed and may become a liquid. The operating fluid in a liquid state may be absorbed in the moisture absorption layer 320, and may return to the first portion 31 along the moisture absorption layer 320 by a capillary force. The heat dissipation member 30 may effectively transfer or diffuse the heat form the heat source through the above circulation process. For reference, in FIG. 14, a circulation path of the operating fluid is indicated by a solid arrow, and the absorption and dissipation of heat are indicated by a dashed arrow.

As described above with reference to FIG. 7, at least one portion of the heat dissipation member 30 may be bent. In an example, a bent portion may be formed between the first portion 31 and the first connection portion 32 and between the first connection portion 32 and the second portion 33. The first portion 31 and the second portion 33 may be substantially flat. The first connection portion 32 may be flat or smoothly bent.

In an embodiment, bending angles of the heat dissipation member 30 may be less than or equal to 90° (e.g., may be a right angle or an acute angle). For example, a bent portion may be located between the first portion 31 and the first connection portion 32 at a first angle $\theta 1$. The first angle $\theta 1$ may be an angle by which the first connection portion 32 rotates in a first bending direction with respect to an extension direction of the first portion 31. Similarly, a bent portion may be located between the first connection portion 32 and the second portion 33 at a second angle $\theta 2$, and the second angle $\theta 2$ is an angle by which the second portion 33 rotates in a second bending direction with respect to an extension direction of the first connection portion 32. Both of the first angle $\theta 1$ and the second angle $\theta 2$ may be less than or equal to 90°.

In a comparative example, when the heat dissipation member 30 is bent at an angle exceeding 90°, the flow of the operating fluid might not be smooth, and thus the heat transfer rate of the heat dissipation member 30 may be decreased. However, according to an embodiment, as the bent angles $\theta 1$ and $\theta 2$ of the heat dissipation member 30 are less than or equal to 90°, the operating fluid may more smoothly flow.

In the above, a display apparatus is mainly described, but the disclosure is not necessarily limited thereto. For example, a method of manufacturing the display apparatus may also be within the scope of the disclosure.

According to the above-described embodiment, as the heat generated from a display panel module is transferred to a rear cover by using a heat dissipation member contacting the display panel module and the rear cover, an excessive increase of the temperature in a partial area of the display panel module may be prevented. Accordingly, a display apparatus in which degradation of the partial area of the display panel module and elements disposed therearound from a high temperature may be prevented, and the quality and lifespan of the display apparatus are increased, and an electronic device including the display apparatus may be provided.

It should be understood that features and aspects within each described embodiment should be considered as available for other similar features or aspects in other embodiments. While one or more embodiments have been described with reference to the figures, it will be understood by those of ordinary skill in the art that various changes in form and details may be made therein without departing from the spirit and scope of the present disclosure.

What is claimed is:

1. An electronic device, comprising:
a display apparatus comprising a display panel module configured to display an image through a front surface thereof and a heat dissipation member disposed on a rear surface of the display panel module; and
a rear cover disposed on the rear surface of the display panel module and spaced apart from the display panel module,
wherein the display panel module comprises a light-emitting element, that is configured to emit light through the front surface, and a transistor electrically connected to the light-emitting element,
wherein the heat dissipation member is disposed between the display panel module and the rear cover and is bent with respect to a bending axis parallel to the rear surface and includes a first portion that is in contact with the display panel module and a second portion that is closer to the rear cover than the first portion is to the rear cover, and
wherein the display apparatus further comprises a pressing member configured to apply a pressure such that the first portion of the heat dissipation member and the display panel module contact each other.

2. The electronic device of claim 1, wherein the display apparatus further comprises a control module disposed between the display panel module and the rear cover and electrically connected to the display panel module, and
wherein the display panel module, the first portion of the heat dissipation member, and the control module overlap one another.

3. The electronic device of claim 2, wherein the second portion of the heat dissipation member does not overlap the control module.

4. The electronic device of claim 2, wherein the control module comprises a circuit substrate on which a timing controller is mounted and a shield member at least partially covering the timing controller.

5. The electronic device of claim 4, wherein the first portion of the heat dissipation member at least partially overlaps the timing controller.

6. The electronic device of claim 5, wherein the control module further comprises a first thermal interface material disposed between the circuit substrate and the shield member.

7. The electronic device of claim 2, wherein the heat dissipation member is bent such that each of the first portion and the second portion at least partially overlap the control module.

8. The electronic device of claim 1, wherein the display panel module comprises:
a display panel comprising a substrate and a light-emitting element disposed on the substrate;
a lower cover covering a first surface of the display panel; and
a first heat transfer sheet disposed between the display panel and the lower cover.

9. The electronic device of claim 1, wherein the second portion of the heat dissipation member comprises a first surface facing the display panel module and a heat sink disposed on the first surface.

10. The electronic device of claim 1, wherein the heat dissipation member comprises a third portion that is disposed at an opposite side of the second portion with respect to the first portion and is farther away from the display panel module than the first portion is to the display panel.

11. The electronic device of claim 10, wherein each of the second portion and the third portion of the heat dissipation member comprises a first surface facing the display panel module and a heat sink disposed on the first surface.

12. The electronic device of claim 1, wherein the pressing member comprises:
a main body portion, which comprises a head located at a first side, and is screw-coupled to a portion of the display panel module at a second side thereof; and
an elastic portion disposed between the head and the first portion of the heat dissipation member.

13. The electronic device of claim 1, wherein a bending angle of the heat dissipation member is less than or equal to 90°.

14. The electronic device of claim 1, wherein the heat dissipation member has a plate shape or a pipe shape.

15. The electronic device of claim 1, wherein the heat dissipation member forms a heat transfer path transferring heat generated from the display panel module to the rear cover.

16. The electronic device of claim 1, further comprising a second heat transfer sheet disposed between the second portion of the heat dissipation member and the rear cover.

17. The electronic device of claim 16, wherein an area of the second heat transfer sheet is greater than an area of the second portion of the heat dissipation member.

18. The electronic device of claim 1, further comprising a second thermal interface material disposed between the second portion of the heat dissipation member and the rear cover.

* * * * *